US012805166B2

(12) United States Patent
Kim et al.

(10) Patent No.: US 12,805,166 B2
(45) Date of Patent: Nov. 17, 2026

(54) DISPLAY PANEL AND DISPLAY DEVICE

(71) Applicant: LG DISPLAY CO., LTD., Seoul (KR)

(72) Inventors: YongCheol Kim, Paju-si (KR); Kyull Han, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 449 days.

(21) Appl. No.: 18/371,137

(22) Filed: Sep. 21, 2023

(65) Prior Publication Data

US 2024/0224750 A1 Jul. 4, 2024

(30) Foreign Application Priority Data

Dec. 29, 2022 (KR) ........................ 10-2022-0188231

(51) Int. Cl.
*H10K 59/80* (2023.01)
*H10K 59/122* (2023.01)
*H10K 59/40* (2023.01)

(52) U.S. Cl.
CPC ......... *H10K 59/879* (2023.02); *H10K 59/122* (2023.02); *H10K 59/40* (2023.02); *H10K 59/8792* (2023.02)

(58) Field of Classification Search
CPC ............... H10K 59/122; H10K 59/124; H10K 59/879
See application file for complete search history.

(56) References Cited

U.S. PATENT DOCUMENTS 10,756,288 B2 8/2020 Kim et al.
2016/0268358 A1* 9/2016 Ito .................... H10K 59/80518
2017/0243932 A1* 8/2017 Ohara ................ H10K 59/1213
2018/0090717 A1* 3/2018 Lim ..................... H10K 59/122
2020/0006709 A1 1/2020 Sim et al.
2020/0119113 A1* 4/2020 Lee ...................... H10K 59/122
(Continued)

FOREIGN PATENT DOCUMENTS

KR 10-2020-0002103 A 1/2020
KR 10-2075728 B1 2/2020
(Continued)

OTHER PUBLICATIONS

Machine translation of KR-20200085690-A (Year: 2020).*

*Primary Examiner* — Bryan R Junge
(74) *Attorney, Agent, or Firm* — Morgan, Lewis & Bockius LLP

(57) ABSTRACT

A display panel and a display device includes: an insulating layer disposed over a substrate and including a concave portion and a inclined portion surrounding the concave portion; a partition wall located in the concave portion and dividing the concave portion; a first electrode located on the insulating layer and the partition wall; a bank disposed on a portion of the upper surface of the first electrode and overlapping a portion of the concave portion; an encapsulation layer located on the first electrode and the bank; a plurality of touch sensor metals disposed on the encapsulation layer; a lens located on the encapsulation layer and located by corresponding to portions divided by the partition wall; and a color conversion layer disposed on or underneath the lens. The plurality of touch sensor metals do not overlap the lens, and are capable of reducing external light reflectance and improve emission efficiency.

23 Claims, 11 Drawing Sheets

(56) References Cited

U.S. PATENT DOCUMENTS

| | | | | |
|---|---|---|---|---|
| 2020/0194711 | A1 | 6/2020 | Kim et al. | |
| 2020/0194713 | A1 | 6/2020 | Kim et al. | |
| 2020/0373520 | A1* | 11/2020 | Kim | H10K 59/121 |
| 2021/0200382 | A1 | 7/2021 | Lee et al. | |
| 2021/0328172 | A1* | 10/2021 | Joo | H10K 50/865 |
| 2021/0359011 | A1 | 11/2021 | Lee | |
| 2022/0020966 | A1* | 1/2022 | Huang | H10K 59/80515 |
| 2022/0069043 | A1* | 3/2022 | Kim | H10K 59/124 |
| 2022/0199715 | A1 | 6/2022 | Kim et al. | |
| 2022/0407037 | A1* | 12/2022 | Itonaga | H05B 33/22 |
| 2024/0172537 | A1* | 5/2024 | Kim | H10K 59/00 |
| 2024/0276848 | A1* | 8/2024 | Hao | H10K 59/879 |
| 2025/0204223 | A1* | 6/2025 | Ishizaki | H10K 59/40 |

FOREIGN PATENT DOCUMENTS

| | | | | |
|---|---|---|---|---|
| KR | 10-2087102 | B1 | 4/2020 | |
| KR | 20200085690 | A * | 7/2020 | H10K 50/8426 |
| KR | 10-2020-0135068 | A | 12/2020 | |
| KR | 10-2262683 | B1 | 6/2021 | |
| KR | 10-2021-0142038 | A | 11/2021 | |
| KR | 10-2022-0087826 | A | 6/2022 | |

* cited by examiner

FIG. 11

| | PXL size | Lens Diameter | Lens Height | A/R (h/r) | Overlap | Efficiency (%) |
|---|---|---|---|---|---|---|
| Comparative example | – | – | – | 0.35 µm | – | 100.0 |
| Embodiment 1 | 12.28 µm | 8.0 µm | 2.80 µm | | – | 133.8 |
| Embodiment 2 | | 10.0 µm | 3.50 µm | | 3.725 µm | 138.0 |
| Embodiment 3 | | | | | | 139.4 |
| Embodiment 4 | | | | | | 140.8 |

DISPLAY PANEL AND DISPLAY DEVICE

CROSS-REFERENCE TO RELATED APPLICATION

This application claims the priority benefit of Republic of Korea Patent Application No. 10-2022-0188231, filed on Dec. 29, 2022 in the Korean Intellectual Property Office, which is incorporated herein by reference in its entirety.

TECHNICAL FIELD

The present disclosure relates to electronic devices with a display, and more specifically, to a display panel and a display device.

DISCUSSION OF THE RELATED ART

Along with the development of information and communication technology, display devices have become increasingly important for serving to provide various information to users via a display screen.

To provide various information to users, display devices may be required to have excellent display quality and high emission efficiency. In particular, the emission efficiency is becoming increasingly important because display devices are required to use limited power as multimedia technology advances.

The emission efficiency of display devices may be determined by light emitting elements included in the display devices. Display devices including light emitting elements with high emission efficiency can have excellent emission efficiency. Therefore, to improve the emission efficiency of display devices, it may be considered to improve the emission efficiency of light emitting elements. However, there are several obstacles to improve the emission efficiency of light emitting elements.

SUMMARY

Accordingly, embodiments of the present disclosure are directed to a display panel and a display device that substantially obviate one or more of the problems due to limitations and disadvantages of the related art.

An aspect of the present disclosure is to provide a display panel and a display device that include an insulating layer including a concave portion, a partition wall located in the concave portion and dividing the concave portion, and lenses corresponding to areas of divided concave portions, and enable low power driving with improved light extraction efficiency.

Another aspect of the present disclosure is to provide a display panel and a display device that are capable of reducing external light reflectance and improving emission efficiency in a structure including a plurality of touch electrodes.

Another aspect of the present disclosure is to provide a display panel and a display device that include an area in which a black matrix disposed on an encapsulation layer and a bank overlapping a portion of a concave portion of an insulating layer on a substrate do not overlap each other, and thereby, have improved luminance and viewing angle characteristics.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display panel comprises: a substrate including a plurality of subpixels including one or more light emitting areas and a non-light emitting area: an insulating layer disposed over the substrate, and including at least one concave portion located in at least one of the plurality of subpixels and at least one inclined portion surrounding the at least one concave portion: at least one partition wall located in the at least one concave portion and dividing the at least one concave portion into two or more sub-concave portions: a first electrode located on the insulating layer and the at least one partition wall: a bank disposed on a portion of the upper surface of the first electrode and overlapping a portion of the at least one concave portion: an encapsulation layer located on the first electrode and the bank: a plurality of touch sensor metals disposed on the encapsulation layer: at least one lens located on the encapsulation layer and located by corresponding to two or more sub-concave portions divided by the at least one partition wall: and a color conversion layer disposed on or underneath the at least one lens, wherein the plurality of touch sensor metals do not overlap the at least one lens.

In another aspect, a display device comprises: a substrate including one or more light emitting areas and a non-light emitting area: an insulating layer disposed over the substrate, and including at least one concave portion and at least one inclined portion surrounding the at least one concave portion: at least one partition wall located in the at least one concave portion and dividing the at least one concave portion into two or more sub-concave portions: a first electrode located on the insulating layer and the at least one partition wall: a bank disposed on a portion of the upper surface of the first electrode and overlapping a portion of the at least one concave portion: an encapsulation layer located on the first electrode and the bank: a plurality of touch sensor metals disposed on the encapsulation layer: at least one lens located on the encapsulation layer and located by corresponding to two or more sub-concave portions divided by the at least one partition wall: and a color conversion layer disposed on or underneath the at least one lens, wherein the plurality of touch sensor metals do not overlap the at least one lens.

According to one or more embodiments of the present disclosure, a display panel and a display device may be provided that include an insulating layer including a concave portion, a partition wall located in the concave portion and dividing the concave portion, and lenses corresponding to area of divided concave portions, and enable low power driving with improved light extraction efficiency.

According to one or more embodiments of the present disclosure, a display panel and a display device may be provided that include a black matrix disposed on a portion of the upper surface of an encapsulation layer in a structure including a plurality of touch electrodes, and thereby, are capable of reducing external light reflectance and improving emission efficiency.

According to one or more embodiments of the present disclosure, a display panel and a display device may be provided that include an area in which a black matrix disposed on an encapsulation layer and a bank overlapping a portion of a concave portion of an insulating layer on a substrate do not overlap each other, and thereby, have improved luminance and viewing angle characteristics.

It is to be understood that both the foregoing general description and the following detailed description are exemplary and explanatory and are intended to provide further explanation of the inventive concepts as claimed

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings:

FIG. 11 illustrates structures of display panels according to Embodiments 1 to 4 of the present disclosure and resulting emission efficiency in the display device according to aspects of the present disclosure.

DETAILED DESCRIPTION

Figure 1:
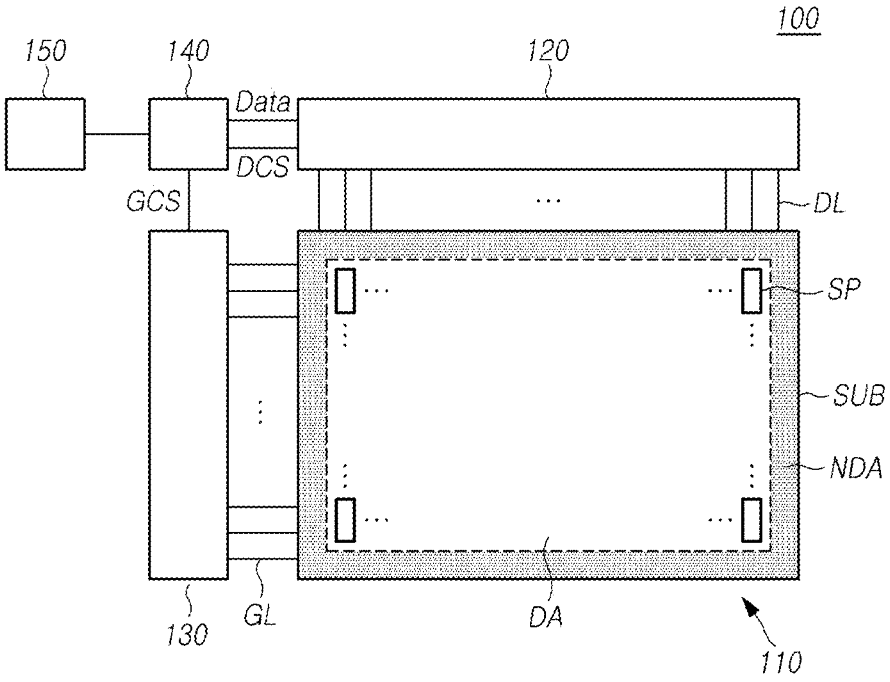
FIG. 1 illustrates an example system configuration of a display device according to aspects of the present disclosure.

Reference will now be made in detail to embodiments of the present disclosure, examples of which may be illustrated in the accompanying drawings.

In the following description, the structures, embodiments, implementations, methods and operations described herein are not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents. In the following description, where the detailed description of the relevant known function or configuration may unnecessarily obscure aspects of the present disclosure, a detailed description of such known function or configuration may be omitted. The shapes, sizes, ratios, angles, numbers, and the like, which are illustrated in the drawings to describe various example embodiments of the present disclosure, are merely given by way of example. Therefore, the present disclosure is not limited to the illustrations in the drawings. Where the terms "comprise," "have," "include." "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

Although the terms "first," "second," A, B, (a), (b), and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

Where positional relationships are described, for example, where the positional relationship between two parts is described using "on," "over," "under," "above." "below;" "beside." "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top." "bottom, "downward," "upward," "upper," "lower," and the like refer to an arbitrary frame of reference.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may." fully encompasses all the meanings of the term "can".

Hereinafter, various embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

FIG. 1 illustrates an example system configuration of a display device 100 according to aspects of the present disclosure.

Referring to FIG. 1, the display device 100 according to aspects of the present disclosure may include a display panel 110 and a driving circuit for driving the display panel 110.

The driving circuit may include a data driving circuit 120, a gate driving circuit 130, and the like, and further include a controller 140 for controlling the data driving circuit 120 and the gate driving circuit 130.

The display panel 110 may include a substrate SUB, and signal lines such as a plurality of data lines DL, a plurality of gate lines GL, and the like disposed over the substrate SUB. The display panel 110 may include a plurality of subpixels SP connected to the plurality of gate lines GL and the plurality of data lines DL.

The display panel 110 may include a display area DA in which one or more images can be displayed and a non-display area NDA located outside of the display area DA and not allowing an image to be displayed. For example, a plurality of subpixels SP for displaying images may be disposed in the display area DA of the display panel 110. The driving circuits (120, 130, and 140) may be electrically connected to, or may be mounted on, the non-display area NDA of the display panel 110, and further, one or more pads to which one or more integrated circuits or one or more printed circuits are connected, may be disposed in the non-display area NDA.

The data driving circuit 120 may be a circuit for driving the plurality of data lines DL, and can supply data signals to the plurality of data lines DL. The gate driving circuit 130 may be a circuit for driving the plurality of gate lines GL, and can supply gate signals to the plurality of gate lines GL. The controller 140 can supply a data control signal DCS to the data driving circuit 120 in order to control an operation time of the data driving circuit 120. The controller 140 can supply a gate control signal GCS to the gate driving circuit 130 in order to control an operation time of the gate driving circuit 130.

The controller 140 can control scanning operation to be started according to a respective time processed for each frame, convert image data inputted from other devices or other image providing sources (e.g., host systems) to a data signal form used in the data driving circuit 120 and then supply image data Data resulting from the converting to the data driving circuit 120, and control data driving to be performed at a predefined time according to a scan process.

In order to control the gate driving circuit 130, the controller 140 can supply several types of gate control signals GCS such as a gate start pulse GSP, a gate shift clock GSC, a gate output enable signal GOE, and the like.

In order to control the data driving circuit 120, the controller 140 can supply several types of data control signals DCS such as a source start pulse SSP, a source sampling clock SSC, a source output enable (SOE) signal, and the like.

The controller 140 may be implemented as a separate component from the data driving circuit 120, or integrated with the data driving circuit 120 and thus implemented in a single integrated circuit.

The data driving circuit 120 can drive a plurality of data lines DL by supplying data voltages corresponding to image data Data received from the controller 140 to the plurality of data lines DL. The data driving circuit 120 may also be referred to as a source driving circuit.

The data driving circuit 120 may include, for example, one or more source driver integrated circuits SDIC.

In one or more embodiments, each source driving circuit SDIC may be connected to the display panel 110 using a tape-automated-bonding (TAB) technique, or connected to a conductive pad such as a bonding pad of the display panel 110 using a chip-on-glass (COG) technique or a chip-on-panel (COP) technique, or connected to the display panel 110 using a chip-on-film (COF) technique.

The gate driving circuit 130 can supply a gate signal of a turn-on level voltage or a gate signal of a turn-off level voltage according to the control of the controller 140. The gate driving circuit 130 can sequentially drive a plurality of gate lines GL by sequentially supplying gate signals of the turn-on level voltage to the plurality of gate lines GL.

For example, the gate driving circuit 130 may be connected to the display panel 110 using the tape-automated-bonding (TAB) technique, or connected to a conductive pad such as a bonding pad of the display panel 110 using the chip-on-glass (COG) technique or the chip-on-panel (COP) technique, or connected to the display panel 110 using the chip-on-film (COF) technique. In one or more embodiments, the gate driving circuit 130 may be disposed in the non-display area NDA of the display panel 110 using a gate-in-panel (GIP) technique. The gate driving circuit 130 may be disposed on a substrate SUB, or connected to the substrate SUB. In an example where the gate driving circuit 130 is implemented using the GIP technique, the gate driving circuit 130 may be disposed in the non-display area NDA of the substrate SUB. The gate driving circuit 130 may be connected to the substrate SUB in examples where the gate driving circuit 130 is implemented using the chip-on-glass (COG) technique, the chip-on-film (COF) technique, or the like.

For example, at least one of the data driving circuit 120 and the gate driving circuit 130 may be disposed in the display area DA. In this example, at least one of the data driving circuit 120 and the gate driving circuit 130 may be disposed not to overlap subpixels SP, or disposed to be overlapped with one or more, or all, of the subpixels SP.

When a specific gate line is selected and driven by the gate driving circuit 130, the data driving circuit 120 can convert image data Data received from the controller 140 into data voltages in an analog form and supply the data voltages resulting from the converting to a plurality of data lines DL.

The data driving circuit 120 may be located in, and/or electrically connected to, but not limited to, only one side or portion (e.g., an upper edge or a lower edge) of the display panel 110. In one or more embodiments, the data driving circuit 120 may be located in, and/or electrically connected to, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 130 may be located in, and/or electrically connected to, but not limited to, only one side or portion (e.g., a left edge or a right edge) of the display panel 110. In one or more embodiments, the gate driving circuit 130 may be located in, and/or electrically connected to, but not limited to, two sides or portions (e.g., a left edge and a right edge) of the panel 110 or at least two of four sides or portions (e.g., an upper edge, a lower edge, the left edge, and the right edge) of the panel 110 according to driving schemes, panel design schemes, or the like.

The controller 140 may be a timing controller used in the typical display technology or a control apparatus/device capable of additionally performing other control functionalities in addition to the typical function of the timing controller. In one or more embodiments, the controller 140 may be one or more other control circuits different from the timing controller, or a circuit or component in the control apparatus/device The controller 140 may be implemented using various circuits or electronic components such as an integrated circuit (IC), a field programmable gate array (FPGA), an application specific integrated circuit (ASIC), a processor, and/or the like.

The controller 140 may be mounted on a printed circuit board, a flexible printed circuit, or the like, and may be electrically connected to the data driving circuit 120 and the gate driving circuit 130 through the printed circuit board, the flexible printed circuit, or the like.

In one or more aspects, the display device 100 may be a display including a backlight unit such as a liquid crystal display device, or may be a self-emissive display such as an organic light emitting diode (OLED) display, a quantum dot (QD) display, a micro light emitting diode (M-LED) display, and the like.

In an embodiment where the display device 100 according to aspects of the present disclosure is an OLED display or is implemented using an OLED display, each subpixel SP may include, as a light emitting element, an organic light emitting diode (OLED), which is a self-emission element. In an embodiment where the display device 100 according to aspects of the present disclosure is a QD display or is implemented using a QD display, each subpixel SP may include a light emitting element configured with quantum dots, which are self-emission semiconductor crystals. In an embodiment where the display device 100 according to aspects of the present disclosure is a micro LED display or is implemented using a micro LED display, each subpixel SP may include, as a light emitting element, a micro light emitting diode (Micro LED), which is a self-emission element and including an inorganic material.

Figure 2:
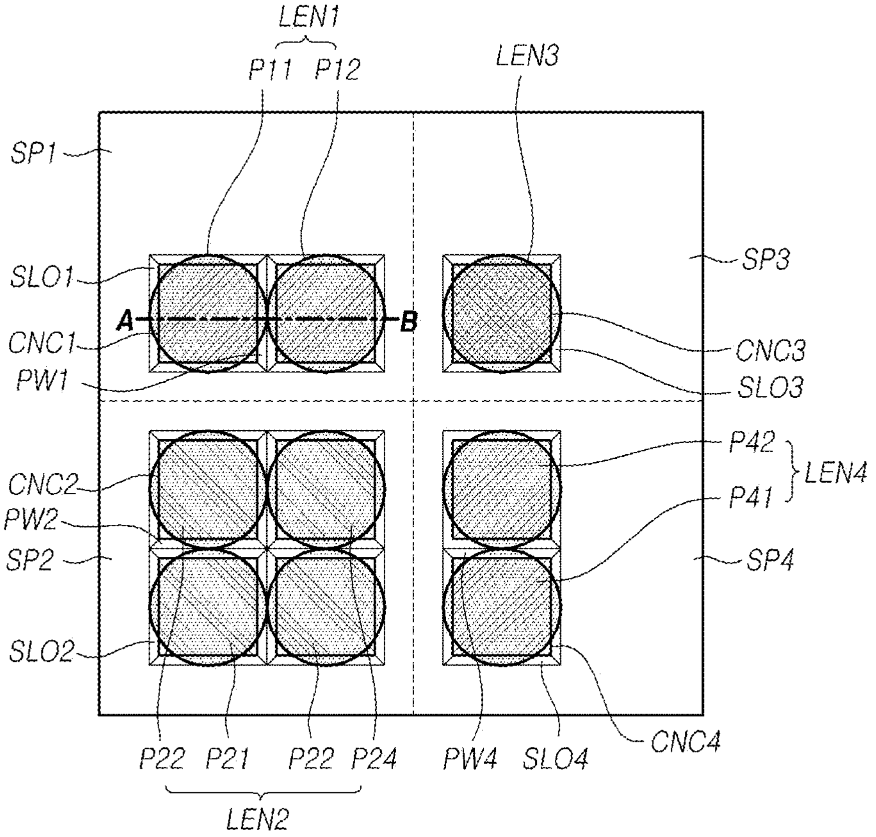
FIG. 2 is an example plan view of the display device according to aspects of the present disclosure.

FIG. 2 is an example plan view of the display device 100 according to aspects of the present disclosure. For example, FIG. 2 illustrates a plan view for a portion of an active area in the display device 100 according to aspects of the present disclosure.

Referring to FIG. 2, in one or more embodiments, the display device 100 according to aspects of the present disclosure may include a plurality subpixels (e.g., SP1, SP2, SP3, SP4, etc.). Four subpixels (SP1, SP2, SP3, and SP4) of the plurality subpixels may be referred to as a first subpixel SP1, a second subpixel SP2, a third subpixel SP3, and a fourth subpixel SP4.

Each of the subpixels (SP1, SP2, SP3, and SP4) may include a respective opening (OPN1, OPN2, OPN3, and OPN4).

In one or more embodiments, the display device 100 according to aspects of the present disclosure may include a plurality of concave portions (e.g., CNC1, CNC2, CNC3, CNC4, etc.). Four concave portions (CNC1, CNC2, CNC3, and CNC4) of the plurality of concave portions may be referred to as a first concave portion CNC1, a second concave portion CNC2, a third concave portion CNC3, and a fourth concave portion CNC4. In one or more embodiments, a light emitting element may be located inside each of the concave portions (CNC1, CNC2, CNC3, and CNC4).

In one or more embodiments, the display device 100 according to aspects of the present disclosure may include a plurality of inclined portions (SLO1, SLO2, SLO3, SLO4, etc.). Four inclined portions (SLO1, SLO2, SLO3, and SLO4) surrounding the concave portions (CNC1, CNC2, CNC3, and CNC4) among the plurality of inclined portions may be located in the subpixels (SP1, SP2, SP3, and SP4), respectively. The four inclined portions (SLO1, SLO2, SLO3, and SLO4) may be referred to as a first inclined portion SLO1, a second inclined portion SLO2, a third inclined portion SLO3, and a fourth inclined portion SLO4.

Referring to FIG. 2, at least one partition wall (PW1, PW2, PW4, etc.) may be disposed in at least one concave portion (CNC1, CNC2, CNC3, and/or CNC4) among the concave portions (CNC1, CNC2, CNC3, and CNC4).

For example, referring to FIG. 2, the at least one partition wall (PW1, PW2, PW4, etc.) may be located in the concave portions (CNC1, CNC2, CNC3, and CNC4). Three partition walls (PW1, PW2, and PW4) among the at least one partition wall may be referred to as a first partition wall PW1, a second partition wall PW2, or a fourth partition wall PW4.

The partition walls (PW1, PW2, and PW4) may divide the concave portions (CNC1, CNC2, and CNC4), respectively. The dividing of the concave portions (CNC1, CNC2, and CNC4) by the partition walls (PW1, PW2, and PW4) may mean that each of the partition walls (PW1, PW2, and PW4) divide each of areas in which the concave portions (CNC1, CNC2, and CNC4) are formed into a plurality of sub-concave portions.

For example, the first partition wall PW1 can divide the first concave portion CNC1 into two sub-first concave portions, the second partition wall PW2 can divide the second concave portion CNC2 into four sub-second concave portions, and the fourth partition wall PW4 can divide the fourth concave portion CNC4 into two sub-fourth concave portions.

In one or more embodiments, the display device 100 according to aspects of the present disclosure may include a plurality of lenses (LEN1, LEN2, LEN3, LEN4, etc.). Four lenses (LEN1, LEN2, LEN3, and LEN4) of the plurality of lenses may be located by corresponding to the concave portions (CNC1, CNC2, CNC3, and CNC4).

The lenses (LEN1, LEN2, LEN3, and LEN4) can serve to change traveling paths of light emitted from the openings (OPN1, OPN2, OPN3, and OPN4) to improve light efficiency. The lenses (LEN1, LEN2, LEN3, and LEN4) may be located by corresponding to the openings (OPN1, OPN2, OPN3, and OPN4), and thus, may have shapes corresponding to shapes of the openings (OPN1, OPN2, OPN3, and OPN4). However, the shapes of the lenses (LEN1, LEN2, LEN3, and LEN4) according to embodiments of the present disclosure are not limited thereto.

The four lenses (LEN1, LEN2, LEN3, and LEN4) of the plurality of lenses may be referred to as a first lens LEN1, a second lens LEN2, a third lens LEN3, and a fourth lens LEN4.

The first to fourth lenses (LEN1, LEN2, LEN3, and LEN4) may be disposed in different subpixels (SP1, SP2, SP3, and SP4) from each other.

Referring to FIG. 2, the first lens LEN1, the second lens LEN2, and the fourth lens LEN4 may be located by corresponding to respective sub-concave portions of the concave portions (CNC1, CNC2, and CNC4) divided by the partition walls (PW1, PW2, and PW4).

For example, sub-first lenses (P11 and P12) of the first lens LEN1 may be located by corresponding to sub-first concave portions of the first concave portion CNC1 divided by the first partition wall PW1. Sub-second lenses (P21, P22, P23, and P24) of the second lens LEN2 may be located by corresponding to sub-second concave portions of the second concave portion CNC2 divided by the second partition wall PW2. Sub-fourth lenses (P41 and P42) of the fourth lens LEN4 may be located by corresponding to sub-fourth concave portions of the fourth concave portion CNC4 divided by the fourth partition wall PW4.

Referring to FIG. 2, the sub-first lenses of the first lens LEN1, the sub-second lenses of the second lens LEN2, and the sub-fourth lenses of the fourth lens LEN4 may be spaced apart from each other.

For example, the sub-first lenses (P11 and P12) of the first lens LEN1 may be spaced apart from each other without overlapping each other, the sub-second lenses (P21, P22, P23, and P24) of the second lens LEN2 may be spaced apart from each other without overlapping each other, and the sub-fourth lenses (P41 and P42) of the fourth lens LEN4 may be spaced apart from each other without overlapping each other.

Each of the sub-first lenses of the first lens LEN1, the sub-second lenses of the second lens LEN2, and the sub-fourth lenses of the fourth lens LEN4 may have a convex lens shape, and be spaced apart from each other.

In one or more embodiments, in order for the display device to produce various colors, a plurality of subpixels emitting light of different colors may be disposed over the substrate.

Some subpixels (SP1, SP2, SP3, and SP4) of the subpixels may emit light of different colors.

For example, a first subpixel SP1 and a second subpixel SP2 emitting light of a color different from that of the first subpixel SP1 may be disposed over the substrate. For example, a first subpixel SP1 and a fourth subpixel SP4 may emit green light, a second subpixel SP2 may emit blue light, and a third subpixel SP3 may emit red light: however, this example is merely one example. Colors of light emitted from subpixels of the display device according to embodiments of the present disclosure are not limited thereto.

In one or more embodiments, the display device 100 according to aspects of the present disclosure may include a plurality of touch sensors disposed over the substrate. Each of the touch sensors may include a plurality of touch sensor metals.

For example, in the display device 100 including the lenses (LEN1, LEN2, LEN3, and LEN4), the lenses (LEN1, LEN2, LEN3, and LEN4) may overlap a plurality of touch sensor metals. In this example, there may be limitations in improving light efficiency of the display device 100 by the plurality of touch sensor metals.

In one or more embodiments, the display device 100 according to aspects of the present disclosure can have structural features capable of preventing the loss of light efficiency, which may be caused by the plurality of touch sensor metals.

Figure 3:
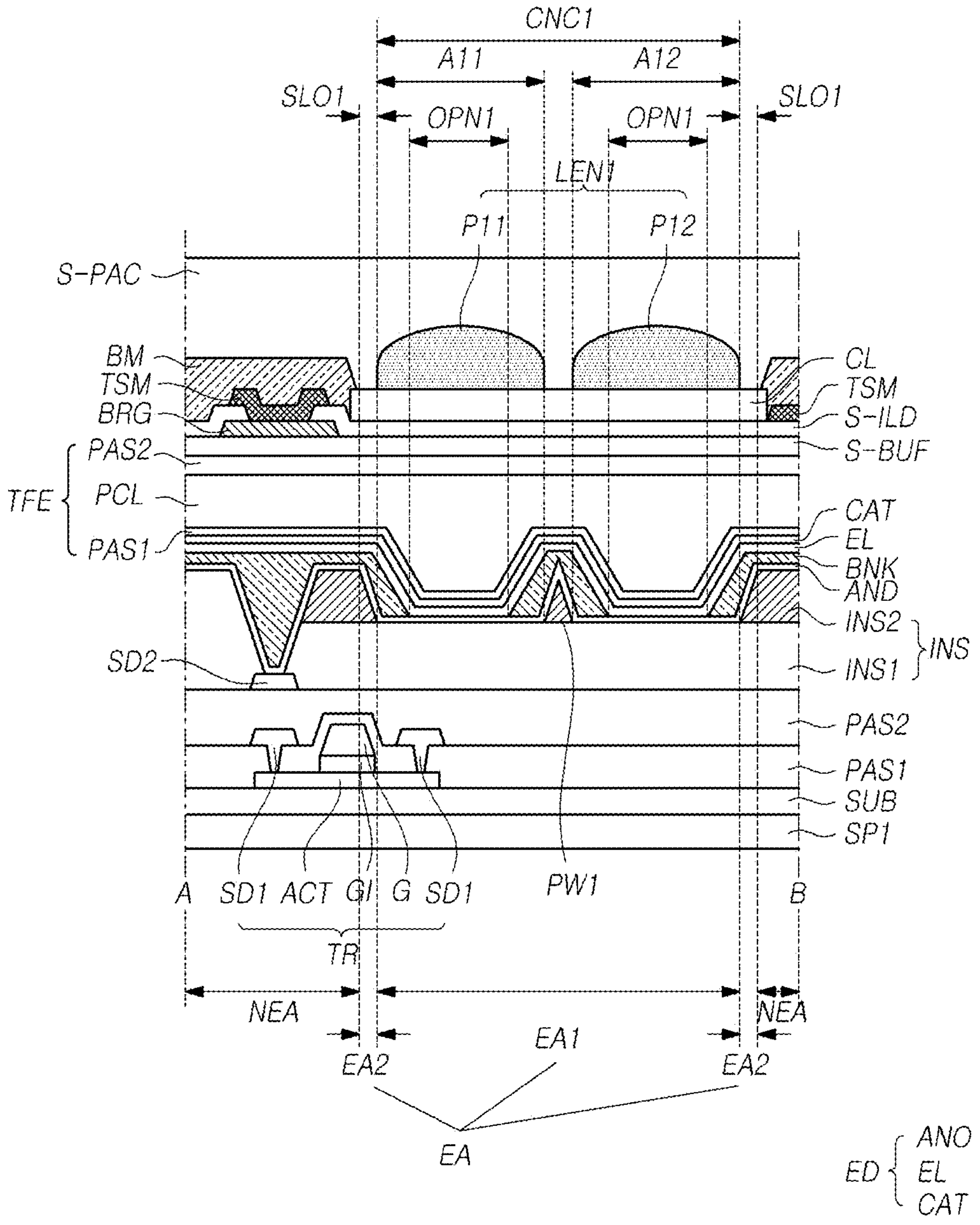
FIG. 3 is an example cross-sectional view taken along line A-B of FIG. 2.

These structural features will be discussed in more detail with reference to FIGS. 3 to 5 below:

FIG. 3 is an example cross-sectional view taken along line A-B of FIG. 2. FIG. 4 illustrates a first light emitting area, a second light emitting area, and a non-light emitting area of FIG. 3. FIG. 5 is a cross-sectional view illustrating an example structure in which a lens overlaps a partition wall.

First, referring to FIG. 3, in one or more embodiments, the display device 100 according to aspects of the present disclosure may include a substrate SUB, an insulating layer INS, the first partition wall PW1, a first electrode AND, an encapsulation layer TFE, and the first lens LEN1.

The first subpixel SP1 may be disposed over the substrate SUB. The substrate SUB may be, for example, a substrate over which one or more transistors TR are disposed, and may be a thin film transistor substrate. The substrate SUB may be, for example, a glass substrate or a plastic substrate.

The transistor TR may be located over the substrate SUB. The transistor TR may include an active layer ACT, a first source-drain electrode SD1, a gate insulating layer GI, and a gate electrode G.

The active layer ACT may be located over the substrate SUB. The active layer ACT may be a layer serving as a channel region of the transistor TR and may include a semiconductor material. For example, the semiconductor material may include an oxide semiconductor such as In—Ga—O (IGO), In—Ga—Zn—O (IGZO), ZnO, or the like.

The first source-drain electrode SD1 may be a source electrode or a drain electrode of the transistor TR. The first source-drain electrode SD1 may be located on a first passivation layer PAS1. The first source-drain electrode SD1 may contact the active layer ACT through a contact hole.

The gate insulating layer GI may be located between the active layer ACT and the gate electrode G. The first passivation layer PAS1 may be located on the active layer ACT, the gate insulating layer GI, and the gate electrode G. The first passivation layer PAS1 may be a layer for protecting circuit elements included in the first subpixel SP1, such as one or more transistors TR, and may be an organic layer or an inorganic layer.

The transistor TR may be a transistor included in the first subpixel SP1 and may be, for example, a driving transistor or a scan transistor. Although FIG. 3 illustrates the top-gate transistor TR as an example, transistors included in the display device 100 according to embodiments of the present disclosure are not limited to such a top-gate structure.

A second passivation layer PAS2 may be located on the first passivation layer PAS1 and the first source-drain electrode SD1. The second passivation layer PAS2 may be an organic layer or an inorganic layer.

A second source-drain electrode SD2 may be located on the second passivation layer PAS2. The second source-drain electrode SD2 may be electrically connected to the first source-drain electrode SD1.

The insulating layer INS may be located over the substrate SUB. The insulating layer INS may include the first concave portion CNC1 and the first inclined portion SLO1.

The first concave portion CNC1 may be located in the first subpixel SUB1. The first inclined portion SLO1 may be located such that it surrounds the first concave portion CNC1. The first concave portion CNC1 may be a portion of the insulating layer INS, which is recessed toward the substrate SUB, and may refer to a portion in which a light emitting element ED is located. The first concave portion CNC1 may refer to a portion located closer to the substrate SUB among portions of the insulating layer INS parallel to the substrate SUB.

The insulating layer INS may be configured with a single layer or a multilayer. For example, the insulating layer INS may be configured with a multilayer including a first insulating layer INS1 and a second insulating layer INS2.

In an example where the insulating layer INS has a stack of a multilayer including the first insulating layer INS1 and the second insulating layer INS2, the first insulating layer INS1 may be located over the substrate SUB, and the second insulating layer INS2 may be located on the first insulating layer INS1. The first concave portion CNC1 may be located on the first insulating layer INS1 and defined by the second insulating layer INS2 having a tapered shape and an inclined surface.

The first inclined portion SLO1 may refer to one portion of the insulating layer INS for connecting a portion located farther from the substrate SUB among the portions of the insulating layer INS parallel to the substrate SUB to the first concave portion CNC1. The first inclined portion SLO1 may be a portion surrounding the first concave portion CNC1 and may refer to a portion for connecting the first concave portion CNC1 to another portion of the insulating layer INS. In the example of FIG. 3, the first inclined portion SLO1 may refer to an inclined surface of the second insulating layer INS2 surrounding a portion of the first insulating layer INS1 constituting the first concave portion CNC1.

The first partition wall PW1 may be located in the first concave portion CNC1. The locating of the first partition wall PW1 in the first concave portion CNC1 may mean that an area in which the first partition wall PW1 is located overlaps an area in which the first concave portion CNC1 is located. For example, on a plane parallel to a viewing surface of the display device 100, the area in which the first partition wall PW1 is located may be located in the area where the first concave portion CNC1 is located. Referring to FIG. 2, the first partition wall PW1 may be located in the first concave portion CNC1.

Referring to FIG. 3, the first partition wall PW1 may divide the first concave portion CNC1. The dividing of the first concave portion CNC1 by the first partition wall PW1 may mean that the first partition wall PW1 is located such that the first partition wall PW1 substantially divide the first concave portion CNC1 into sub-first concave portions. Referring to FIG. 2, the first concave portion CNC1 may be divided into two sub-first concave portions by the first partition wall PW1, and the second concave portion CNC2 may be divided into four sub-second concave portions by the second partition wall PW2.

Referring to FIG. 3, the first concave portion CNC1 may include a first sub-first concave portion A11 and a second sub-first concave portion A12 divided by the first partition wall PW1. The first sub-first concave portion A11 may be a portion of the first concave portion CNC1 and may be referred to as a first area of the first concave portion. The second sub-first concave portion A12 may be a portion of the first concave portion CNC1 and may be referred to as a second area of the first concave portion.

When the first partition wall PW1 divides the first concave portion CNC1, it is desired to consider shapes of respective openings of subpixels. Since the first lens LEN1 has the highest light extraction efficiency when the first lens LEN1 has a circular shape on a plane, the display device 100 can have excellent light extraction efficiency when the sub-first concave portions of the first concave portion CNC1 divided by the first partition wall PW1 are configured in a substantially point-symmetrical shape.

For example, referring to FIG. 2, the sub-first concave portions of the first concave portion CNC1 divided by the first partition wall PW1 may have a square shape. For example, respective areas of the first sub-first concave portion A11 and the second sub-first concave portion A12 of the first concave portion may be substantially the same as each other.

That is, the first partition wall PW1 can divide the first concave portion CNC1 into a plurality of areas having substantially the same area. When respective areas of the first sub-first concave portion A11 and the second sub-first concave portion A12 are substantially the same, sub-first lenses (P11 and P12) of the first lens LEN1, which are located such that they correspond to the first sub-first concave portion A11 and the second sub-first concave portion A12, can have a curvature necessary for light extraction in all areas.

Referring to FIG. 3, the first partition wall PW1 may include the same material as the insulating layer INS. For example, the first partition wall PW1 may include the same material as the first insulating layer INS1 or the second insulating layer INS2. When the first partition wall PW1 includes the same material as the insulating layer INS, since the first partition wall PW1 can be formed together with the insulating layer INS in the process of forming the insulating layer INS, the first partition wall PW1 can be therefore formed without an additional process.

The first partition wall PW1 may have an inclined surface. The inclined surface of the first partition wall PW1 may be a portion of the first partition wall PW1, and refer to a portion that is not parallel to the substrate SUB and has a predetermined angle relative to the substrate SUB.

When the first partition wall PW1 has the inclined surface, the first electrode AND, which is a reflective electrode, may be located on the first partition wall PW1. When the first electrode AND, which is a reflective electrode, is located on the inclined surface of the first partition wall PW1, light emitted from a corresponding light emitting element ED can be reflected by the first electrode AND located on the inclined surface of the first partition wall PW1, and thereby, the display device can have excellent light extraction efficiency.

As described above, the inclined surface of the first partition wall PW1 may refer to a shape enabling the first electrode AND located on the inclined surface of the first partition wall PW1 to reflect light emitted from the light emitting element ED.

The first electrode AND may be located on the insulating layer INS and the first partition wall PW1. The first electrode AND is an electrode included in the light emitting element ED, and may be, for example, an anode electrode or a cathode electrode. The first electrode AND may be, for example, a pixel electrode.

The first electrode AND may contact the second source-drain electrode SD2 through a contact hole.

The first electrode AND may be a reflective electrode. The first electrode AND may be configured with a single layer or a multilayer. In an example where the first electrode AND has a stack of a multilayer, the first electrode AND may include at least one conductive layer and at least one reflective material layer.

The first electrode AND may be located on the first inclined portion SLO1. When the first electrode AND, which is a reflective electrode, is located on the first inclined portion SLO1, light emitted from the light emitting element ED can be reflected more effectively, and therefore, the display device 100 can have excellent light extraction efficiency.

A bank BNK may be located on the first electrode AND. The bank BNK may include a first opening OPN1 defining a light emitting area of the first subpixel SP1.

The bank BNK may be located such that it overlaps the first partition wall PW1. The overlapping of the bank BNK with the first partition wall PW1 may mean that the bank BNK is located on the first partition wall PW1.

An emission layer EL located on the inclined surface of the first partition wall PW1 may be formed by deposition. When the emission layer EL is formed on the inclined surface of the first partition wall PW1 through a deposition process, the emission layer EL may be formed thinly due to characteristics of the deposition process. When the emission layer EL is formed thinly, a short circuit between the first electrode AND and a second electrode CAT may occur due to the thin emission layer EL. In order to prevent this issue, the bank BNK may be located such that it overlaps the first partition wall PW1.

The emission layer EL may be located on the bank BNK and the first electrode AND. The emission layer EL may be a layer located between the first electrode AND and the second electrode CAT, and be a layer allowing light to emit by the combining of holes and electrons moving from the first electrode AND and the second electrode CAT. The emission layer EL may be configured with a multilayer, and may be an inorganic layer or an organic layer. For example, the emission layer EL may be an organic emission layer, and the light emitting element ED may be an organic light emitting element. However, light emitting elements ED of the display device 100 according to embodiments of the present disclosure are not limited thereto.

The second electrode CAT may be located on the emission layer EL. The second electrode CAT may be an electrode included in the light emitting element ED, and may be a cathode electrode or an anode electrode. The second electrode CAT may be, for example, a common electrode.

Each subpixel (e.g., SP1, SP2, SP3, and SP4) included in the display device 100 may include a light emitting area formed by light emitted from the light emitting element ED including the first electrode AND, the emission layer EL, and the second electrode CAT. The light emitting area disposed in each subpixel may include at least two sub-light emitting areas.

Figure 4:
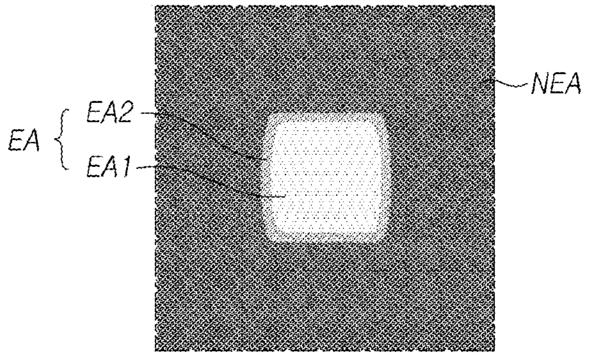
FIG. 4 illustrates a first light emitting area, a second light emitting area, and a non-light emitting area of FIG. 3.

For example, as shown in FIGS. 3 and 4, the first subpixel SP1 may include a first sub-light emitting area EA1 and a second sub-light emitting area EA2 surrounding the first sub-light emitting area EA1.

The first sub-light emitting area EA1 may be an area corresponding to the first concave portion CNC1, and the second sub-light emitting area EA2 may be an area corresponding to the first inclined portion SLO1.

As shown in FIGS. 3 and 4, the second sub-light emitting area EA2 may be a structure surrounded by a non-light emitting area NEA.

The first sub-light emitting area EA1 and the second sub-light emitting area EA2 may emit light of different wavelengths.

In FIGS. 3 and 4, the first sub-light emitting area EA1 may be an area through which light emitted from the light emitting element ED is allowed to travel directly to the outside of the display device 100 without being reflected from the first electrode AND located in the first inclined portion SLO1. The second sub-light emitting area EA2 may be an area through which light emitted from the light emitting element ED is allowed to travel to the outside after being reflected from the first electrode AND located in the first inclined portion SLO1.

Since light in the first sub-light emitting area EA1 and light in the second sub-light emitting area EA2 can finally exit the display device 100 after passing through a color conversion layer CL disposed on the encapsulation layer TFE, light exiting through the display device 100 or the display panel 110 can have a same wavelength or a same range of wavelengths.

In this implementation, it should be understood that respective luminance of light emitted from the first sub-light emitting area EA1 and light emitted from the second sub-light emitting area EA2 may be different. For example, the luminance of the first sub-light emitting area EA1 may be higher than the luminance of the second sub-light emitting area EA2, but embodiments of the present disclosure are not limited thereto.

The discussions provided for the first subpixel SP1 with reference to FIGS. 3 and 4 may also be substantially equally applied to the second subpixel SP2, the third subpixel SP3, and the fourth subpixel SP4 as discussed in FIG. 2 unless otherwise specified. The first subpixel SP1 and the fourth subpixel SP4 may be substantially the same. Except that the concave portion CNC2, the partition wall PW2, and the lens LEN2 included in the second subpixel SP2 have different shapes from the concave portion CNC1, the partition wall PW1, and the lens LEN1 included in the first subpixel SP1, the second subpixel SP2 may have the same configuration as the first subpixel SP1. Except that since the third subpixel SP3 does not include a partition wall, the concave portion CNC3 thereof is not divided into sub-concave portions, and the lens LEN3 thereof does not include sub-lenses, the third subpixel SP3 may have the same configuration as the first subpixel SP1.

For example, referring to FIG. 3 with respect to the second subpixel SP2, the insulating layer INS may include the second concave portion CNC2 and the second inclined portion SLO2 surrounding the second concave portion CNC2 located in the second subpixel SP2. The second partition wall PW2 may be located in the second concave portion CNC2 and may divide the second concave portion CNC2. The first electrode AND may be located on the insulating layer INS and the second partition wall PW2. The second lens LEN2 may be located on the encapsulation layer TFE, and be located such that it corresponds to sub-second concave portions of the second concave portion CNC2 divided by the second partition wall PW2.

Referring to FIG. 3, each of the sub-first concave portions of the first concave portion CNC1 divided by the first partition wall PW1 and each of the sub-second concave portions of the second concave portion CNC2 divided by the second partition wall PW2 may have substantially the same area.

In addition, each of sub-fourth concave portions of the fourth concave portion CNC4 divided by the fourth partition wall PW4 may have substantially the same area as each of the sub-first concave portions of the first concave portion CNC1 divided by the first partition wall PW1 and each of the sub-second concave portions of the second concave portion CNC2 divided by the second partition wall PW2.

Each of the sub-first concave portions of the first concave portion CNC1 divided by the first partition wall PW1, and each of the sub-second concave portions of the second concave portion CNC2 divided by the second partition wall PW2, and each of the sub-fourth concave portions of the fourth concave portion CNC4 divided by the fourth partition wall PW4 may have substantially the same area as the third concave portion CNC3.

That is, respective areas of sub-concave portions of the concave portions (CNC1, CNC2, and CNC4) divided by the partition walls (PW1, PW2, and PW4) may be the substantially same as the area of the concave portion CNC3 having the smallest area. The lenses (LEN1, LEN2, LEN3, and LEN4) may be formed by a same photolithography process.

When the lenses (LEN1, LEN2, LEN3, and LEN4) are formed by the same photolithography process, the first lens LEN1, the second lens LEN2, the third lens LEN3, and the fourth lens LEN4 may have the same height.

When the partition walls (PW1, PW2, and PW4) divide the concave portions (CNC1, CNC2, and CNC4) as described above, the lenses (LEN1, LEN2, LEN3, and LEN4) having the same height may have substantially the same aspect ratio. Having the same aspect ratio by the lenses (LEN1, LEN2, LEN3, and LEN4) may mean that respective portions included in the lenses (LEN1, LEN2, LEN3, and LEN4) have the same aspect ratio.

Referring to FIG. 3, the encapsulation layer TFE may be disposed on the light emitting element ED.

The encapsulation layer TFE may be located on the first electrode AND. The encapsulation layer TFE may be a layer for protecting circuit elements of the first subpixel SP1 including the light emitting element ED, and may be located on the light emitting element ED. For example, the encapsulation layer TFE may be located on the second electrode CAT.

The encapsulation layer (TFE) may be configured with a single layer or a multilayer. For example, the encapsulation layer TFE may include a first encapsulation layer PAS1, a second encapsulation layer PCL, and a third encapsulation layer PAS2. The encapsulation layer TFE may be an organic layer or an inorganic layer. For example, each of the first encapsulation layer PAS1, the second encapsulation layer PCL, and the third encapsulation layer PAS2 may be an organic layer or an inorganic layer.

One or more touch sensors may be disposed on the encapsulation layer TFE.

Referring to FIG. 3, the touch sensor may include touch sensor metals TSM and one or more bridge metals BRG. In one or more embodiments, the touch sensor may further include a sensor buffer layer S-BUF, a sensor interlayer insulating layer S-ILD, a sensor protective layer S-PAS, and the like.

The sensor buffer layer S-BUF may be disposed on the encapsulation layer ENCAP. The bridge metals BRG may be disposed on the sensor buffer layer S-BUF, and the sensor interlayer insulating layer S-ILD may be disposed on the bridge metals BRG.

The sensor buffer layer S-BUF and the sensor interlayer insulating layer S-ILD may extend to the non-display area NDA of the display panel 110, as well as the display area DA.

The touch sensor metals TSM may be disposed on the sensor interlayer insulating layer S-ILD. A respective portion of each or at least one of the touch sensor metals TSM may be connected to a corresponding bridge metal BRG through a hole in the sensor interlayer insulating layer S-ILD.

One touch electrode (or one touch electrode line) may include a plurality of touch sensor metals TSM, and the plurality of touch sensor metals TSM may be arranged in a mesh pattern and be electrically connected to each other. The touch sensor metals TSM may be electrically to each other through one or more bridge metals BRG. Thereby, one touch electrode (or one touch electrode line) can be formed by the electrical connection of the touch sensor metals TSM.

The touch sensor metals TSM and the one or more bridge metal BRG may not overlap the light emitting area EA. For example, referring to FIG. 3, the touch sensor metals TSM and the bridge metal BRG may not overlap the first sub-light emitting area EA1 and the second sub-light emitting area EA2.

The touch sensor metals TSM and the bridge metal BRG may be disposed in the non-light emitting area NEA of the subpixels (SP1, SP2, SP3, and SP4).

In a case where the touch sensor metals TSM and the bridge metal BRG overlap the first sub-light emitting area EA1 and the second sub-light emitting area EA2, the amount of light exiting through the display panel 110 after being emitted from the light emitting element ED can be reduced, and therefore, luminance in the light emitting area EA can be reduced. In contrast, in the display device 100 according to the embodiments of the present disclosure, since the touch sensor metals TSM and the bridge metal BRG do not overlap the first sub-light emitting area EA1 and the second sub-light emitting area EA2, high luminance characteristics can be maintained while touch sensing function is provided.

Referring to FIG. 3, the color conversion layer CL and a black matrix BM may be disposed on the sensor interlayer insulating layer S-ILD.

The color conversion layer CL may be formed from a material obtained by including quantum dots or a dye in a base resin.

For example, the base resin may be a thermosetting resin.

Quantum dots can emit light of specific colors as electrons transition from the conduction band to the valence band. Quantum dots may have a core-shell structure. The core may be a semiconductor nanocrystal material. For example, the core of the quantum dots may include silicon (Si)-based nanocrystals, group II-VI compound nanocrystals, group III-V compound nanocrystals, and the like, but embodiments of the present disclosure are not limited thereto.

The dye may be a dye having low light resistance, and for example, be a yellow azo dye.

Referring to FIG. 3, the color conversion layer CL may overlap all of the first sub-light emitting area EA1 and the second sub-light emitting area EA2. In one or more embodiments, the color conversion layer CL may be disposed in a portion of the non-light emitting area NEA surrounding the second sub-light emitting area EA2.

The black matrix BM may be disposed on a portion of the upper surface of the sensor interlayer insulating layer S-ILD and the touch sensor metals TSM. The black matrix BM may be disposed in the non-light emitting area NEA.

The black matrix BM may also be disposed on a portion of the upper surface of the color conversion layer CL in the non-light emitting area NEA, but example structures of the display device according to embodiments of the present disclosure are not limited thereto. For example, one side, or a portion of a side surface, of the black matrix BM may contact one side, or a portion of a side surface, of the color conversion layer CL.

Referring to FIG. 3, all of the black matrix BM may overlap a portion of the bank BNK.

The bank BNK may overlap all of the non-light emitting area NEA in the display area DA and may also overlap a portion of the light emitting area EA. For example, referring to FIG. 3, the bank BNK may be disposed in all of the non-light emitting area NEA of the display area DA, and be disposed in a portion of the first sub-light emitting area EA1 and all of the second sub-light emitting area EA2.

In contrast, the black matrix BM may be disposed only in a portion of the non-light emitting area NEA.

The black matrix BM may not overlap a portion of the bank BK.

For example, a width of an area where the bank BK does not overlap the black matrix BM may be 3 μm to 4 μm, but embodiments of the present disclosure are not limited thereto.

When a width of the area where the bank BK does not overlap with the black matrix BM is less than 3 μm, viewing angle characteristics may be reduced. For example, in a case where the bank BK and the black matrix BM entirely overlap in the display area DA, when viewing the display device from the side, the luminance of the side of the display device may be greatly reduced. On the other hand, in the display device 100 according to the embodiments of the present disclosure, since a portion of the bank BK does not overlap the black matrix BM, the luminance cannot be reduced even when the display device is viewed from the side, and thus, luminance and viewing angle characteristics can be improved.

When a width of the area where the bank BK does not overlap the black matrix BM exceeds 4 μm, the amount of external light absorbed by the black matrix BM may be reduced, and thus, the external light reflectance of the display device may be increased.

The black matrix BM disposed on the sensor interlayer insulating layer S-ILD and respective concave portions (CNC1, CNC2, CNC3, and CNC4) of subpixels (SP1, SP2, SP3, and SP4) may not overlap.

In one or more embodiments, the black matrix BM may not overlap the respective inclined portions (SLO1, SLO2, SLO3, and SLO4) surrounding the concave portions (CNC1, CNC2, CNC3, and CNC4).

A distance between the black matrix BM and the inclined portions (SLO1, SLO2, SLO3, and SLO4) surrounding the concave portions (CNC1, CNC2, CNC3, and CNC4) may be 5 μm to 8 μm.

The distance between the black matrix BM and the inclined portions (SLO1, SLO2, SLO3, and SLO4) surrounding the concave portions (CNC1, CNC2, CNC3, and CNC4) may refer to a minimum length in a direction perpendicular to a direction in which the sense buffer layer S-BUF is stacked on the encapsulation layer TFE.

When a distance between the black matrix BM and the inclined portions (SLO1, SLO2, SLO3, and SLO4) surrounding the concave portions (CNC1, CNC2, CNC3, and CNC4) is less than 8 μm, light emitted from the second sub-light emitting area EA2 of the display device 100 may not exit through the display device 100 or the display panel 110 and be absorbed by the black matrix BM. Thereby, light efficiency can be reduced.

When a distance between the black matrix BM and the inclined portions (SLO1, SLO2, SLO3, and SLO4) surrounding the concave portions (CNC1, CNC2, CNC3, and CNC4) exceeds 8 μm, an external light reflectance can increase because an area in which the black matrix BM absorbs or reflects external light is reduced.

In the display device 100 according to embodiments of the present disclosure, since a distance between the black matrix BM and the inclined portions (SLO1, SLO2, SLO3, and SLO4) surrounding the concave portions (CNC1, CNC2, CNC3, and CNC4) is 5 μm to 8 μm, light emitted from the first sub-light emitting area EA1 and the second sub-light emitting area EA2 can exit through the display panel 110 without being absorbed by the black matrix BM. Thereby, light efficiency can be improved, and external light reflectance cannot increase.

Referring to FIG. 3, at least one lens (e.g., the first lens LEN1) may be disposed on the color conversion layer CL.

For example, the first lens LEN1 may be located such that it corresponds to sub-first concave portions of the first concave portion CNC1 divided by the first partition wall PW1. The corresponding of the first lens LEN1 to the sub-first concave portions of the first concave portion CNC1 divided by the first partition wall PW1 may mean that the first lens LEN1 includes a plurality of portions corresponding to the sub-first concave portions of the first concave portion CNC1 divided by the first partition wall PW1.

Since the first lens LEN1 is located such that it corresponds to sub-first concave portions of the first concave portion CNC1 divided by the first partition wall PW1, the first lens LEN1 can direct, to the outside of the display device, light directed toward the front of the display device by the first partition wall PW1 and the first inclined part SLO1 after being emitted from the light emitting element, and thereby, the display device 100 can have excellent light extraction efficiency.

For example, the first lens LEN1 may include a first sub-first lens P11, and a second sub-first lens P12. The first sub-first lens P11 may correspond to the first sub-first concave portion A11, and the second sub-first lens P12 may correspond to the second sub-first concave portion A12.

The first lens LEN1 may be located such that the first lens LEN1 does not overlap a portion of an area where the first partition wall PW1 is located.

For example, the first sub-first lens P11 and the second sub-first lens P12 of the first lens LEN1 may be located such that they are spaced apart from each other. Since the first sub-first lens P11 and the second sub-first lens P12 are spaced apart from each other on the first partition wall PW1, the first lens LEN1 may be located such that it does not overlap at least a portion of the area where the first partition wall PW1 is located. As the first lens LEN1 is disposed such that it does not overlap a portion of the first partition wall PW1, the first sub-first lens P11 and the second sub-first lens P12 of the first lens LEN1 can have a higher aspect ratio. Accordingly, the first lens LEN1 can extract light more effectively.

A sensor planarization layer S-PAC may be located on the first lens LEN1. The sensor planarization layer S-PAC may be, for example, an optical adhesive layer. The sensor planarization layer S-PAC may a lower refractive index than the first lens LEN1, and therefore, light passing through the first lens LEN1 can exit through the display panel 110 or the display device 100 without being trapped at an interface between the sensor planarization layer S-PAC and the first lens LEN1.

Referring to FIG. 3, in one or more embodiments, the display device 100 according to aspects of the present disclosure may not include a separate polarizing plate.

In one or more embodiments, the display device 100 according to aspects of the present disclosure can reduce external light reflectance through the black matrix BM disposed on the touch sensor metals TSM and the bridge metal BRG and the color conversion layer CF disposed in the light emitting area EA and a portion of the non-light emitting area NEA, and further, control an increase in reflectance of the display panel 110 by the touch sensor metals TSM and the bridge metal BRG.

According to one or more embodiments, since the display device 100 does not include a separate polarizing plate, a reduction in light efficiency can be prevented, which can be caused by a situation where light emitted from the light emitting areas (EA1 and EA2) is absorbed by the polarizing plate. According to one or more embodiments, the display device 100 can reduce external light reflectance through the color conversion layer CL and the black matrix BM disposed on the encapsulation layer TFE.

Meanwhile, with reference to FIGS. 2 to 4, the discussions on the first lens LEN1 have been provided based on the structure in which the first lens LEN1 does not overlap a portion of the area where the first partition wall PW1 is located, but the embodiments of the present disclosure are limited to thereto.

Figure 5:
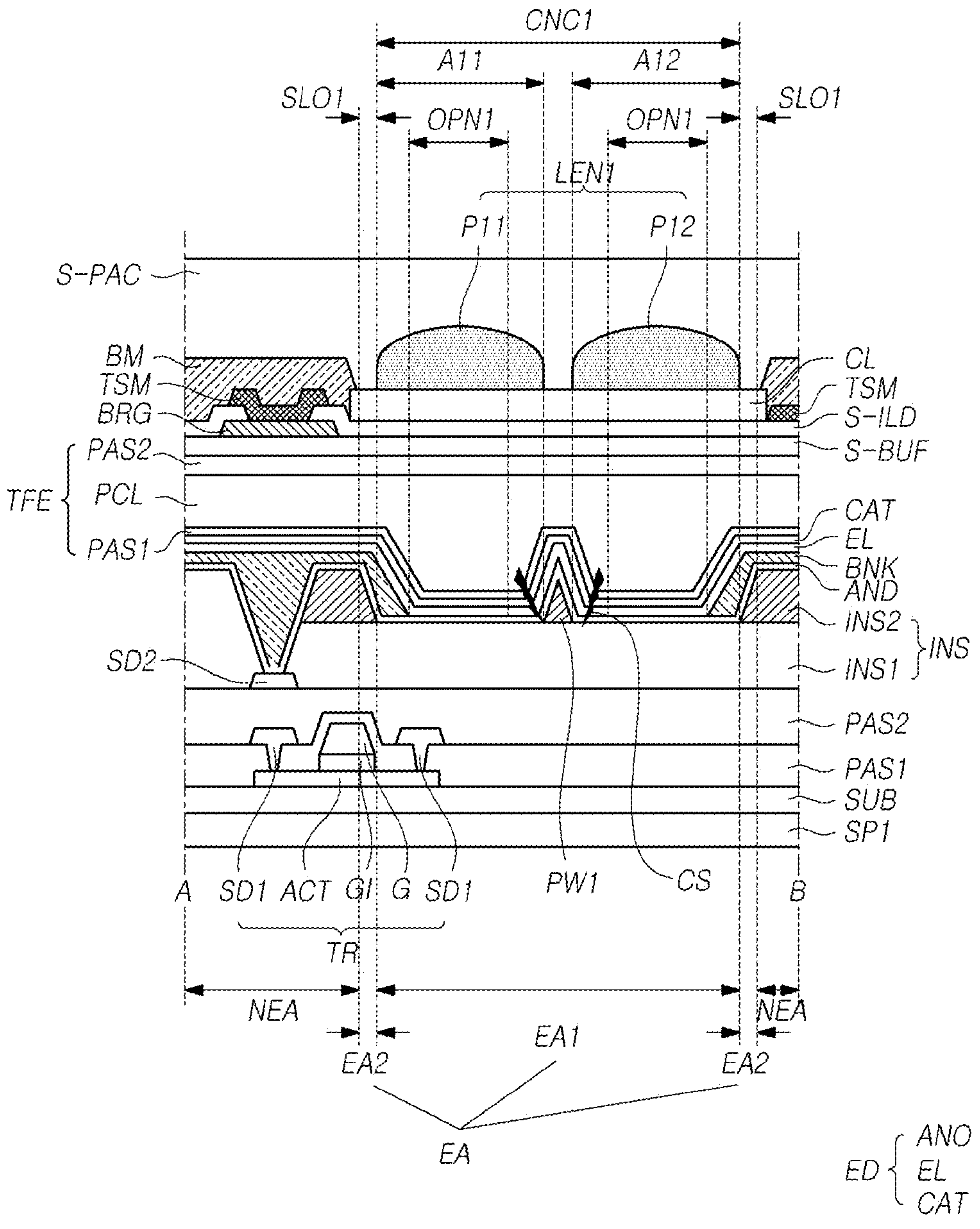
FIG. 5 is a cross-sectional view illustrating an example structure in which a lens overlaps a partition wall.

As shown in FIG. 5, the first lens LEN1 may be locate such that it overlaps all, or at least a portion, of an area in which the first partition wall PW1 is located.

For example, an area where the first sub-first lens P11 of the first lens LEN1 is located and an area where the second sub-first lens P12 of the first lens LEN1 is located may overlap all of an area in which the first partition wall PW1 is located. When the first lens LEN1 overlaps all of the area in which the first partition wall PW1 is located, the first lens LEN1 can extract light more effectively.

In this implementation, the bank BNK may be located such that it does not overlap the first partition wall PW1. That is, the bank BNK may not be located on the first partition wall PW1, and by this configuration, an area of a corresponding opening OPN1 may be larger or wider than that the opening OPN1 of the display device 100 according to the example configuration shown in FIG. 3.

It should be understood here that when the bank BNK is not located on the first partition wall PW1, a thickness of the emission layer EL located on the first partition wall PW1 may be much smaller than a thickness of the emission layer EL located in another area. This issue can be caused by the feature that the emission layer EL can be formed thinly on an inclined surface due to characteristics of the deposition process when the emission layer EL is formed by deposition.

When the emission layer EL is formed thinly on the first partition wall PW1, a short circuit may occur between the first electrode AND and the second electrode CAT.

To address this issue, the second electrode CAT may include a structure CS in which the second electrode CAT is disconnected along the first partition wall PW1. The disconnected structure of the second electrode CAT may be attributed by the feature that the first partition wall PW1 has a sufficiently steep slope.

For example, when the first partition wall PW1 has a sufficiently inclined surface, the second electrode AND formed on the first partition wall PW1 may have a structure in which the second electrode AND is disconnected along the first partition wall PW1. For example, when the first partition wall PW1 has a steep slope having an angle of 70° or more, the second electrode CAT may have a structure CS in which the second electrode CAT is disconnected along the first partition wall PW1. The angle of the inclined surface of the first partition wall PW1 may refer to an angle of the inclined surface of the first partition wall PW1 relative to a plane parallel to the substrate SUB.

Figure 6:
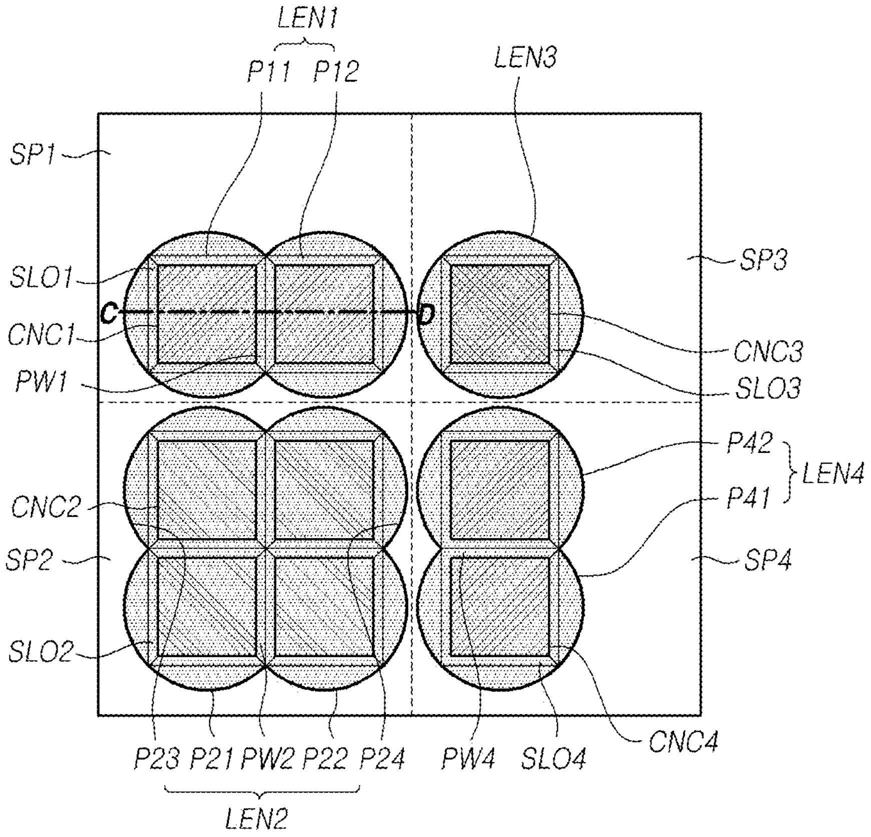
FIG. 6 is an example plan view of the display device according to aspects of the present disclosure.

FIG. 6 is an example plan view of the display device 100 according to aspects of the present disclosure. For example, FIG. 6 illustrates a plan view for a portion of the active area in the display device 100 according to aspects of the present disclosure.

An example configuration of the display device 100 shown in FIG. 6 may be the same as the example configuration of the display device 100 shown in FIG. 2 discussed above unless otherwise specified.

Referring to FIG. 6, lenses (LEN1, LEN2, LEN3, and LEN4) may be located such that they respectively overlap respective all of areas where concave portions (CNC1, CNC2, CNC3, and CNC4) are located.

In one or more embodiments, the lenses (LEN1, LEN2, LEN3, and LEN4) may be located such that they respectively overlap respective all of areas where inclined portions (SLO1, SLO2, SLO3, and SLO4) are located. When the lenses (LEN1, LEN2, LEN3, and LEN4) are located such that they respectively overlap respective all of areas where the concave portions (CNC1, CNC2, CNC3, and CNC4) are located and respectively overlap respective all of areas where the concave portions (CNC1, CNC2, CNC3, and CNC4) are located, the lenses (LEN1, LEN2, LEN3, and LEN4) can more effectively extract light emitted from the display device 100, and thus, the display device 100 can have high light efficiency.

Sub-lenses (P11, P12, P21, P22, P23, P24, P41, and P42) of the lenses (LEN1, LEN2, LEN3, and LEN4) may be located such that they overlap each other.

For example, a first sub-first lens P11 and a second sub-first lens P12 of a first lens LEN1 may overlap each other. For example, the first sub-first lens P11 and the second sub-first lens P12 may have circular shapes overlapping each other. A first sub-second lens P21, a second sub-second lens P22, a third sub-second lens P23, and a fourth sub-second lens P24 of a second lens LEN2 may be located such that they overlap each other.

For example, the first sub-second lens P21, the second sub-second lens P22, the third sub-second lens P23, and the fourth sub-second lens P24 of the second lens LEN2 may have circular shapes overlapping each other. A first sub-fourth lens P41 and a second sub-fourth lens P42 of a fourth lens LEN4 may be located such that they overlap each other. For example, the first sub-fourth lens P41 and the second sub-fourth lens P42 may have circular shapes overlapping each other.

Figure 7:
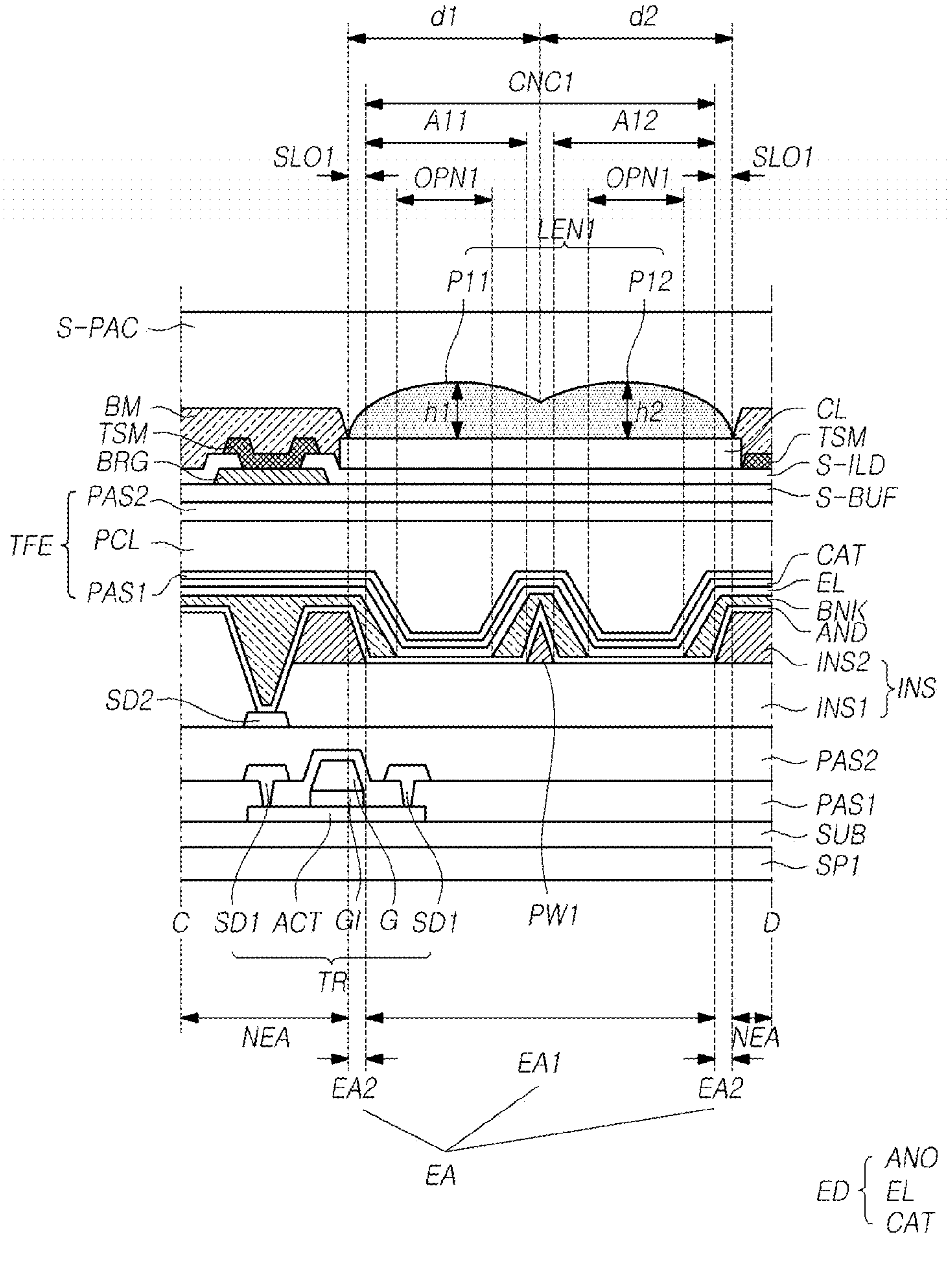
FIG. 7 is an example cross-sectional view taken along with line C-D of FIG. 6.

FIG. 7 is an example cross-sectional view taken along with line C-D of FIG. 6.

An example configuration of the display device 100 shown in FIG. 7 may be the same as the example configuration of the display device 100 shown in FIG. 3 discussed above unless otherwise specified.

Referring to FIG. 7, the first lens LEN1 may include the first sub-first lens P11 and the second sub-first lens P12. The first sub-first lens P11 and the second sub-first lens P12 may be located such that they overlap each other. An area where the first sub-first lens P11 and the second sub-first lens P12 overlap may overlap an area where the first partition wall PW1 is located. When the first sub-first lens P11 and the second sub-first lens P121 included in the first lens LEN1 overlap each other, the first lens LEN1 can more effectively extract light emitted from a corresponding light emitting device ED.

Referring to FIG. 7, the first sub-first lens P11 and the second sub-first lens P121 of the first lens LEN1 may overlap each other in an area less than 20% of the diameter of each of the first sub-first lens P11 and the second sub-first lens P121. Through this configuration, a surface of an area in which the first sub-first lens P11 and the second sub-first lens P121 overlap can have a curved area, and thereby, light can be uniformly extracted from the entire upper surface of the first lens LEN1.

In one or more embodiments, respective diameters (d1 and d2) of the first sub-first lens P11 and the second sub-first lens P121 of the first lens LEN1 may be 50% to 60% of one side of the light emitting area EA defined in the subpixel in which the first lens LEN1 is disposed.

In one or more embodiments, respective heights (h1 and h2) of the first sub-first lens P11 and the second sub-first lens P121 of the first lens LEN1 may be 0.35 times the respective diameters (d1 and d2) of the first sub-first lens P11 and the second sub-first lens P121.

Through this configuration, respective aspect ratios (or height to diameter ratios) of the first sub-first lens P11 and the second sub-first lens P121 of the first lens LEN1 can be maintained at 0.35.

Accordingly, the amount of light directed toward the front of the display device 100 after being emitted from the light emitting element can be increased, and a certain amount of light can be extracted through the lens regardless of a size of the light emitting area and a size of the display device 100.

In one or more embodiments, in FIG. 7, a side surface of the first lens LEN1 may contact a side surface of the black matrix BM.

Referring to FIG. 7, the first lens LEN1 may overlap all of the light emitting area EA, and the black matrix BM may overlap the non-light emitting area NEA.

For example, the first lens LEN1 may be disposed such that it overlaps each of the first sub-light emitting area EA1 and the second sub-light emitting area EA2, thereby improving light extraction efficiency.

Meanwhile, although FIG. 7 illustrates the structure in which the color conversion layer CL is disposed between the sensor interlayer insulating layer S-ILD and the first lens LEN1, but structures of the display device 100 according to embodiments of the present disclosure are not limited thereto.

Hereinafter, example structures of the display device 100 according to aspects of the present disclosure will be described with reference to FIGS. 8 to 10.

Figure 8:
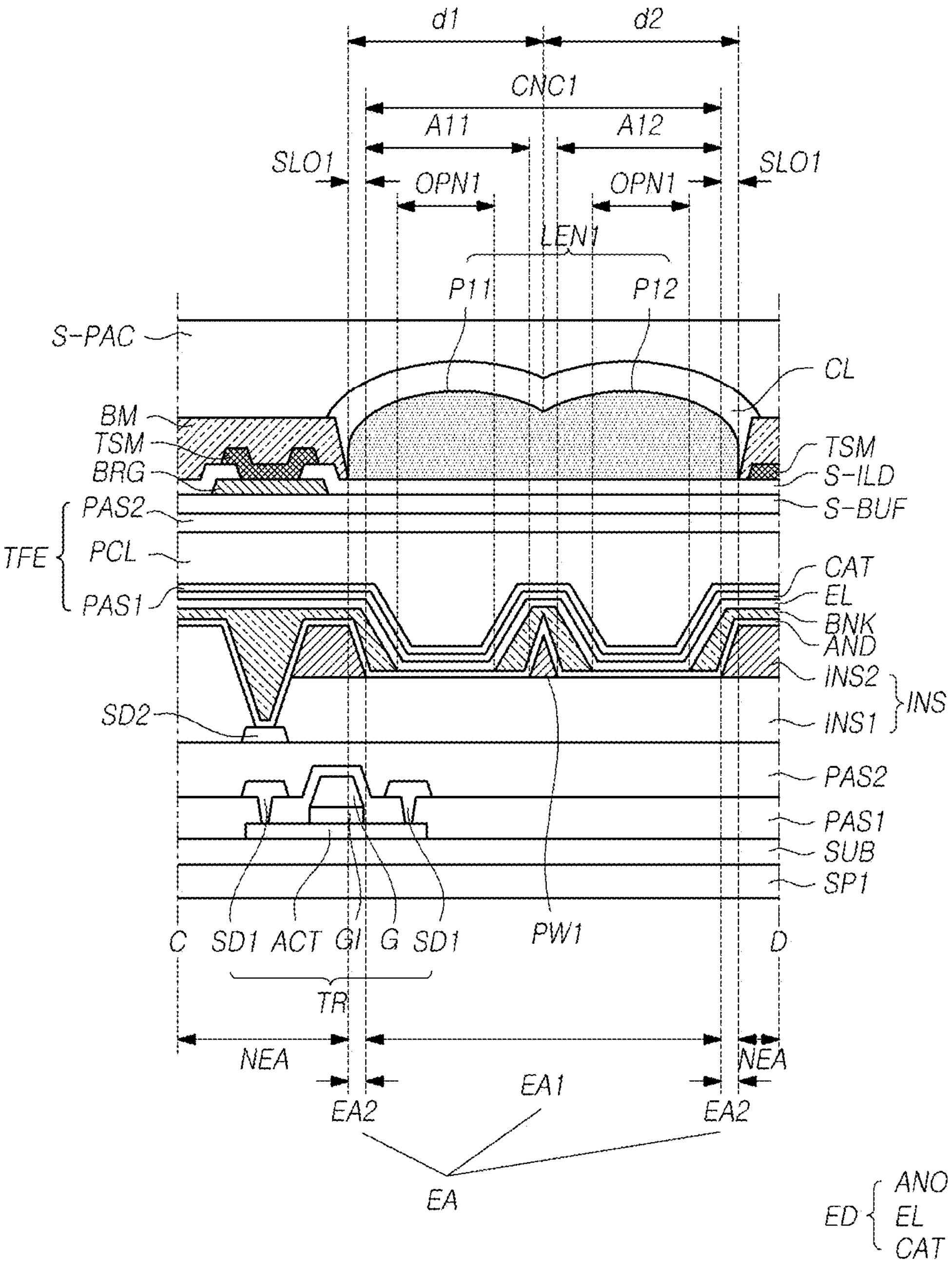
FIGS. 8 to 10 illustrate example stackup configurations of the display device according to aspects of the present disclosure.
Figure 9:
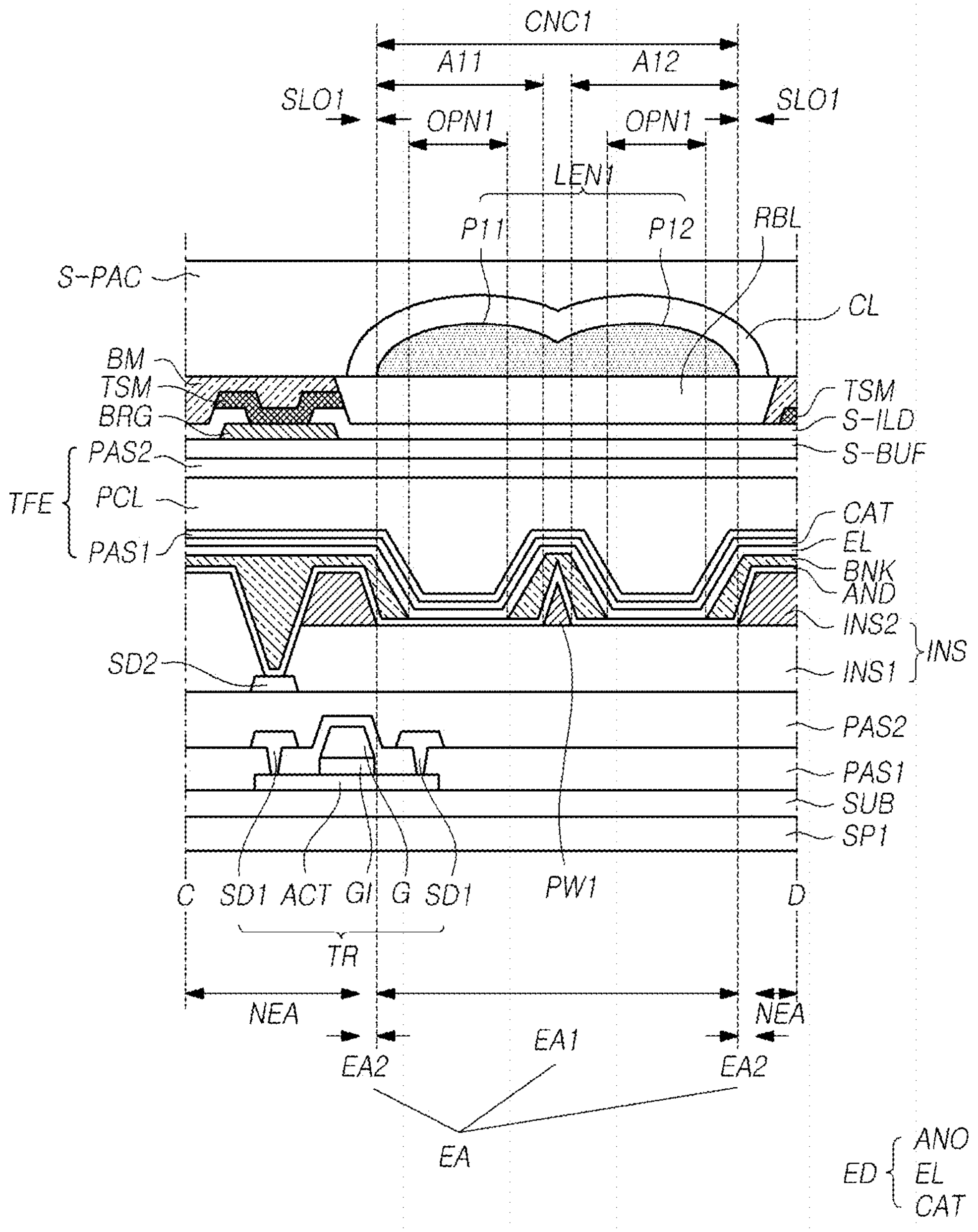
Figure 10:
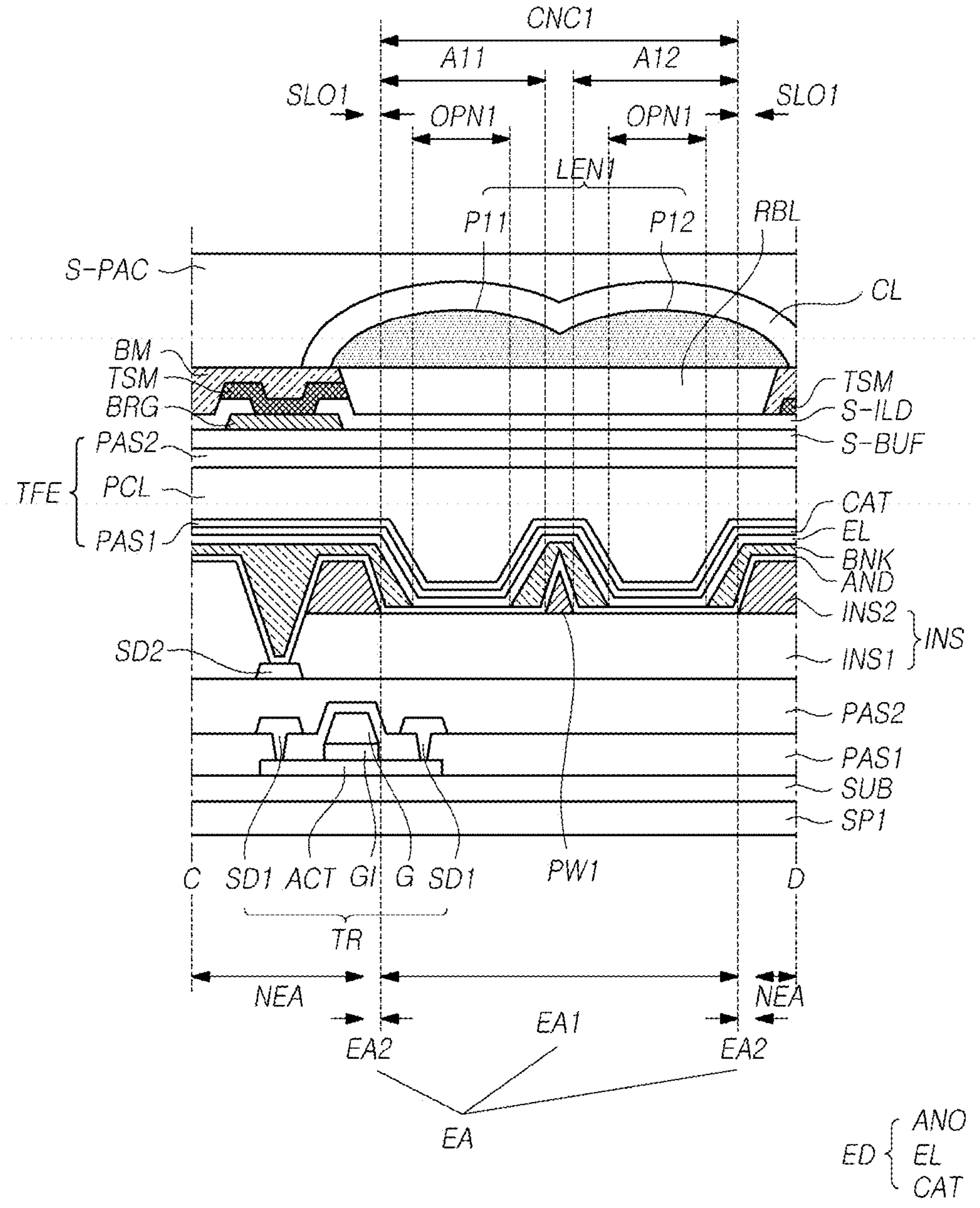

FIGS. 8 to 10 illustrate example stackup configurations of the display device 100 according to aspects of the present disclosure.

Example configurations of the display device 100 shown in FIGS. 8 to 10 may be the same as the example configuration of the display device 100 shown in FIG. 7 discussed above unless otherwise specified.

First, referring to FIG. 8, a color conversion layer CL may be disposed between a first lens LEN1 and the sensor planarization layer S-PAC.

As shown in FIG. 8, a first sub-first lens P11 and a second sub-first lens P12 of the first lens LEN1 may be located such that they overlap each other.

The color conversion layer CL may be disposed on the first lens LEN1. The color conversion layer CL may overlap the first sub-first lens P11 and the second sub-first lens P12. In one or more embodiments, the color conversion layer CL may overlap a portion of the non-light emitting area NEA. A portion of the black matrix BM and a portion of the color conversion layer CL may overlap in the non-light emitting area NEA where the color conversion layer CL is disposed.

Through this structure, the amount of light directed to the outside of the display device 100 through the first lens LEN1 after being emitted from the light emitting element can be increased.

However, structures of the display device 100 according to embodiments of the present disclosure are not limited thereto.

For example, the first lens LEN1 may be disposed such that it corresponds to a first concave portion CNC1. In one or more embodiments, the color conversion layer CL may be disposed such that it corresponds to the first concave portion CNC1 and a first inclined portion SLO1.

In this structure, the first lens LEN1 and the color conversion layer CL may be disposed such that they are spaced apart from the black matrix. Through this configuration, the second sub-light emitting area EA2 corresponding to the first inclined portion SLO1 of the first concave portion CNC1 may not be covered by the black matrix BM.

In one or more embodiments, referring to FIGS. 9 and 10, the display device 100 according to aspects or the present disclosure may include a refraction auxiliary layer RBL disposed between the first lens LEN1 and the sensor interlayer insulating layer S-ILD.

For example, referring to FIGS. 9 and 10, a plurality of touch sensor metals TSM may be disposed on the sensor interlayer insulating layer S-ILD.

The refraction auxiliary layer RBL may be disposed on the sensor interlayer insulating layer S-ILD. The refraction auxiliary layer RBL may overlap the first concave portion CNC1 and the first inclined portion SLO1. For example, the refraction auxiliary layer RBL may overlap the first sub-light emitting area EA1 and the second sub-light emitting area EA2.

The refraction auxiliary layer RBL may also overlap a portion of the non-light emitting area NEA. A side surface of the refraction auxiliary layer RBL may contact a side surface of the black matrix BM disposed in the non-light emitting area NEA.

Referring to FIGS. 9 and 10, the first lens LEN1 may be disposed on the refraction auxiliary layer RBL.

The refraction auxiliary layer RBL and the first lens LEN1 may include an inorganic insulating material having high refractive properties or an organic insulating material having high refractive properties.

For example, the refraction auxiliary layer RBL and the first lens LEN1 may include an inorganic insulating material including silicon. For example, the refraction auxiliary layer RBL and the first lens LEN1 may include at least one of silicon nitride (SiNx), silicon oxide (SiOx), and silicon oxynitride (SiON).

When the refraction auxiliary layer RBL and the first lens LEN1 include an inorganic insulating material, they may be formed over the substrate SUB through a deposition process such as chemical vapor deposition (CVD), and patterned through a dry etching process, and the like. Through these processes, the refraction auxiliary layer RBL and the first lens LEN1 shown in FIG. 9 or 10 can be formed finally.

The refraction auxiliary layer RBL and the first lens LEN1 may include at least one of a photoactive compound PAC and a photo acid generator PAG.

When the refraction auxiliary layer RBL and the first lens LEN1 include an organic insulating material, they may be formed over the substrate SUB through a process such as spin coating, slit coating, or the like, and patterned through a photolithography process using a mask. Through these processes, finally, the refraction auxiliary layer RBL and the first lens LEN1 shown in FIG. 9 or 10 can be formed.

The refraction auxiliary layer RBL and the first lens LEN1 may include the same material. In this implementation, there may be no boundary between the refraction auxiliary layer RBL and the first lens LEN1, but embodiments of the present disclosure are not limited thereto.

The refraction auxiliary layer RBL and the first lens LEN1 may include different materials. In this implementation, the first lens LEN1 may include a material having a higher refractive index than the refraction auxiliary layer RBL.

The refractive index of the refractive auxiliary layer RBL and the first lens LEN1 may be 1.7 to 1.95, but embodiments of the present disclosure are not limited thereto.

For example, the refractive index of the refractive auxiliary layer RBL and the first lens LEN1 may be determined according to a condition under which the refractive index of the first lens LEN1 is equal to or greater than the refractive index of the refractive auxiliary layer RBL. Through this configuration, the efficiency of condensing light reaching the first lens LEN1 after passing through the refraction auxiliary layer RBL can be improved.

In one or more embodiments, the refractive index of the first lens LEN1 may be greater than the refractive index of the color conversion layer CL disposed on the first lens LEN1 and may be greater than the refractive index of the sensor planarization layer S-PAC.

Referring to FIGS. 9 and 10, since a surface of the first lens LEN1 has a convex shape, even when the refractive index of the first lens LEN1 is greater than those of the color conversion layer CL and the sensor planarization layer S-PAC, light from the light emitting element can be directed to the outside of the display device 100 without a significant change in traveling paths of light.

In one or more embodiments, the first lens LEN1 and the color conversion layer CL may be disposed in various locations.

For example, referring to FIG. 9, the first lens LEN1 may overlap the first concave portion CNC1 and the first inclined portion SLO1. For example, the first lens LEN1 may overlap at least a portion of the light emitting area EA. For example, the first lens LEN1 may overlap the first sub-light emitting area EA1 and the second sub-light emitting area EA2.

In one or more embodiments, referring to FIG. 9, the color conversion layer CL disposed on the first lens LEN1 may overlap the first concave portion CNC1 and the first inclined portion SLO1, and may overlap a portion of the non-light emitting area NEA.

As shown in FIG. 9, it should be noted that the color conversion layer CL may not overlap the black matrix BM disposed in the non-light emitting area NEA.

For example, a distance between the black matrix BM and the first lens LEN1 may be 5 μm to 8 μm, and a distance between the black matrix BM and the color conversion layer CL may be 5 μm or more.

The distance between the black matrix BM and the first lens LEN1 and the distance between the black matrix BM and the color conversion layer CL may refer to a minimum length in a direction perpendicular to a direction in which the sense buffer layer S-BUF is stacked on the encapsulation layer TFE.

When a distance between the black matrix BM and the first lens LEN1 is less than 8 μm, light emitted from the second sub-light emitting area EA2 of the display device 100 overlapping the first lens LEN1 cannot exit through the display device 100, and be absorbed by the black matrix BM. Thereby, light efficiency can be lowered.

When a distance between the black matrix BM and the first lens LEN1 exceeds 8 μm, an area where the black matrix BM absorbs or reflects external light can be reduced, and thereby, reflectance of the external light can increase.

Structures of the display device 100 according to embodiments of the present disclosure are not limited thereto. For example, as shown in FIG. 10, the first lens LEN1 and the color conversion layer CL disposed on the first lens LEN1 may overlap the first and second sub-light emitting areas (EA1 and EA2) and extend to a portion of the non-light emitting area NEA.

In this implementation, the first lens LEN1 and the color conversion layer CL may extend to a portion of the upper surface of the black matrix BM.

Since the first lens LEN1 and the color conversion layer CL are extended to a portion of the upper surface of the black matrix BM, light extraction efficiency can be improved by preventing some of light emitted from the light emitting element ED from being trapped inside the display device without transmitting through the first lens LEN1.

Referring to FIGS. 9 and 10, each of the black matrix BM and the refraction auxiliary layer RBL may have a thickness of 2 μm to 3 μm.

When the refractive auxiliary layer RBL has a thickness of 2 μm to 3 μm, a refractive index of 1.7 to 1.95 may be maintained. For example, the refractive auxiliary layer RBL may have a refractive index of 1.92 at a wavelength of 450 nm, a refractive index of 1.88 at a wavelength of 550 nm, and a refractive index of 1.86 at a wavelength of 650 nm. However, refractive index values of the refractive auxiliary layer RBL according to embodiments of the present disclosure are not limited thereto.

Since the refraction auxiliary layer RBL has a thickness of 2 μm to 3 μm, transmittance of the refraction auxiliary layer RBL may be maintained at 89% to 95% in a visible light wavelength band.

Further, since the black matrix BM has a thickness of 2 μm to 3 μm, as shown in FIGS. 9 and 10, the refraction auxiliary layer RBL can be formed without a step.

As a result, even when the first lens LEN1 is disposed on the refraction auxiliary layer RBL and the black matrix BM, light can be directed to the outside of the display device 100 without refraction of light due to a step.

Next, light efficiency of the display device 100 according to aspects of the present disclosure will be discussed with reference to FIG. 11.

FIG. 11 illustrates structures of display panels according to Embodiments 1 to 4 of the present disclosure and resulting emission efficiency in the display device 100 according to aspects of the present disclosure.

In FIG. 11, Embodiment 1 may represent the display device having the configuration of FIG. 3, Embodiment 2 may represent the display device having the configuration of FIG. 7, Embodiment 3 may represent the display device having the configuration of FIG. 8, and Embodiment 4 may represent the display device having the configuration of FIG. 9.

Referring to FIG. 11, a length of one side of one light emitting area formed in each of the configurations of Embodiments 1 to 4 may be 12.28 μm, a diameter of one sub-lens included in each lens of Embodiment 1 may be 8 μm, and a diameter of one sub-lens included in each lens of Embodiments 2 to 4 may be 10 μm.

Further, an aspect ratio A/R of one sub-lens included in each lens of Embodiments 1 to 4 may be 0.35.

A length of an area where the first sub-first lens P11 and the second sub-first lens P12 of each lens of Embodiments 2 to 4 overlap may be 3.75 μm.

Referring to FIG. 11, when the emission efficiency of a light emitting area of a typical organic light emitting display device is 100%, it can be seen that the emission efficiency of each of Embodiments 1 to 4 exceeds 100%.

That is, the display device 100 according to the embodiments of the present disclosure can produce high emission efficiency through the structure including the plurality of lenses LEN, the color conversion layer CL, and the partition walls disposed on the encapsulation layer.

Meanwhile, a display device according to Comparative example of FIG. 11 may be a display device having a structure in which a concave portion is disposed in a subpixel and a light emitting element is disposed in an area overlapping the concave portion.

According to the embodiments described herein, the display panel 110 and the display device 100 may be provided that include an insulating layer including a concave portion, a partition wall located in the concave portion and dividing the concave portion, and lenses corresponding to area of divided concave portions, and enable low power driving with improved light extraction efficiency.

According to the embodiments described herein, the display panel 110 and the display device 100 may be provided that include a black matrix disposed on a portion of the upper surface of an encapsulation layer in a structure including a plurality of touch electrodes, and thereby, are capable of reducing external light reflectance and improving emission efficiency.

According to the embodiments described herein, the display panel 110 and the display device 100 may be provided that include an area in which a black matrix disposed on an encapsulation layer and a bank overlapping a portion of a concave portion of an insulating layer on a substrate do not overlap each other, and thereby, have improved luminance and viewing angle characteristics.

It will be apparent to those skilled in the art that various modifications and variations can be made in the display panel and the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display panel, comprising:

a substrate comprising a plurality of subpixels comprising at least one light emitting area and a non-light emitting area;

an insulating layer disposed over the substrate and comprising at least one concave portion located in at least one of the plurality of subpixels and at least one inclined portion surrounding the at least one concave portion;

at least one partition wall located in the at least one concave portion and dividing the at least one concave portion;

a first electrode located on the insulating layer and the at least one partition wall;

a bank disposed on a portion of an upper surface of the first electrode and overlapping a portion of the at least one concave portion;

an encapsulation layer located on the first electrode and the bank;

a plurality of touch sensor metals disposed on the encapsulation layer;

at least one lens located on the encapsulation layer and located such that the at least one lens corresponds to sub-concave portions of the at least one concave portion divided by the at least one partition wall;

a color conversion layer disposed on or underneath the at least one lens, a refraction auxiliary layer disposed on the encapsulation layer; and a black matrix disposed on the plurality of touch sensor metals and disposed in a same layer as the refraction auxiliary layer, wherein the refraction auxiliary layer overlaps all of the at least one light emitting area and a portion of the non-light emitting area, and wherein a material of the plurality of touch sensor metals do not overlap a material of the at least one lens in a plan view.

2. The display panel of claim 1, further comprising:

a bridge metal disposed between the encapsulation layer and the plurality of touch sensor metals; and a black matrix disposed on the plurality of touch sensor metals, wherein the plurality of touch sensor metals and the bridge metal overlap the bank and the black matrix.

3. The display panel of claim 2, wherein the black matrix is disposed in at least a portion of the non-light emitting area, and wherein the bank is disposed in all of the non-light emitting area and a portion of the at least one light emitting area, and does not overlap the black matrix in the at least one light emitting area and a portion of the non-light emitting area.

4. The display panel of claim 1, wherein the at least one concave portion comprises a first sub-concave portion and a second sub-concave portion divided by the at least one partition wall.

5. The display panel of claim 4, wherein the at least one lens comprises a first sub-lens corresponding to the first sub-concave portion and a second sub-lens corresponding to the second sub-concave portion.

6. The display panel of claim 5, wherein the color conversion layer is disposed on the encapsulation layer, and the at least one lens is disposed on the color conversion layer, and wherein the first sub-lens and the second sub-lens of the at least one lens are spaced apart from each other.

7. The display panel of claim 1, wherein the at least one lens comprises a first sub-lens and a second sub-lens, which respectively correspond to a first sub-concave portion and a second sub-concave portion of the at least one concave portion divided by the at least one partition wall, and wherein the first sub-lens and the second sub-lens overlap all of an area in which the at least one partition wall is located.

8. The display panel of claim 7, further comprising: a black matrix disposed on the plurality of touch sensor metals in the non-light emitting area, wherein the black matrix overlaps a portion of an upper surface of the color conversion layer or contacts a side surface of the color conversion layer, and wherein the at least one lens is disposed on the color conversion layer and contacts a portion of a side surface of the black matrix.

9. The display panel of claim 8, wherein the at least one lens overlaps a portion of the at least one light emitting area corresponding to the at least one concave portion and the at least one inclined portion, and wherein the color conversion layer overlaps all of the at least one light emitting area and a portion of the non-light emitting area.

10. The display panel of claim 7, further comprising: a black matrix disposed on the plurality of touch sensor metals in the non-light emitting area, wherein the at least one lens is disposed on the encapsulation layer and contacts a portion of a side surface of the black matrix, and wherein the color conversion layer is disposed on the at least one lens and extends to a portion of an upper surface of the black matrix.

11. The display panel of claim 1, wherein a refractive index of the refractive auxiliary layer is equal to or less than a refractive index of the at least one lens disposed on the refractive auxiliary layer.

12. The display panel of claim 11, wherein the refractive index of the refractive auxiliary layer and the refractive index of the at least one lens are 1.7 to 1.95.

13. The display panel of claim 11, wherein the at least one lens is disposed in a portion of the at least one light emitting area overlapping the at least one concave portion and the at least one inclined portion, wherein the color conversion layer disposed on the at least one lens overlaps the at least one light emitting area and a portion of the non-light emitting area, and wherein a portion of the color conversion layer overlaps the bank and does not overlap the black matrix.

14. The display panel of claim 11, wherein the at least one lens and the color conversion layer disposed on the at least one lens overlaps all of the at least one light emitting area and a portion of the non-light emitting area, and wherein the at least one lens and the color conversion layer overlap a portion of the bank and a portion of the black matrix.

15. The display panel of claim 1, further comprising:

an emission layer located on the first electrode; and a second electrode located on the light emission layer, wherein the bank overlaps at least one partition wall, and the second electrode is formed integrally in the at least one concave portion.

16. The display panel of claim 1, further comprising:

an emission layer located on the first electrode; and a second electrode located on the light emission layer, wherein the bank does not overlap at least one partition wall, and the second electrode comprises a structure in which the second electrode is disconnected along the at least one partition wall.

17. The display panel of claim 1, wherein the at least one of the plurality of subpixels comprises the at least one light emitting area, and wherein the at least one light emitting area comprises a first sub-light emitting area corresponding to the at least one concave portion and a second sub-light emitting area surrounding the first sub-light emitting area and corresponding to the at least one inclined portion.

18. A display device, comprising:

a substrate comprising at least one light emitting area and a non-light emitting area;

an insulating layer disposed over the substrate and comprising at least one concave portion and at least one inclined portion surrounding the at least one concave portion;

at least one partition wall located in the at least one concave portion and dividing the at least one concave portion;

a first electrode located on the insulating layer and the at least one partition wall;

a bank disposed on a portion of an upper surface of the first electrode and overlapping a portion of the at least one concave portion;

an encapsulation layer located on the first electrode and the bank;

a plurality of touch sensor metals disposed on the encapsulation layer;

at least one lens located on the encapsulation layer and located such that the at least one lens corresponds to sub-concave portions of the at least one concave portion divided by the at least one partition wall;

a color conversion layer disposed on or underneath the at least one lens, a refraction auxiliary layer disposed on the encapsulation layer; and a black matrix disposed on the plurality of touch sensor metals and disposed in a same layer as the refraction auxiliary layer, wherein the refraction auxiliary layer overlaps all of the at least one light emitting area and a portion of the non-light emitting area, and wherein a material of the plurality of touch sensor metals do not overlap a material of the at least one lens in a plan view.

19. The display device of claim 18, wherein a refractive index of the refractive auxiliary layer is equal to or less than a refractive index of the at least one lens disposed on the refractive auxiliary layer.

20. The display device of claim 18, wherein the color conversion layer has an upper surface and a lower surface that are parallel to each other.

21. The display panel of claim 1, wherein the color conversion layer has an upper surface and a lower surface that are parallel to each other.

22. A display device, comprising:

a substrate comprising at least one light emitting area and a non-light emitting area;

an insulating layer disposed over the substrate and comprising at least one concave portion and at least one inclined portion surrounding the at least one concave portion;

at least one partition wall located in the at least one concave portion and dividing the at least one concave portion;

a first electrode located on the insulating layer and the at least one partition wall;

a bank disposed on a portion of an upper surface of the first electrode and overlapping a portion of the at least one concave portion;

an encapsulation layer located on the first electrode and the bank;

a plurality of touch sensor metals disposed on the encapsulation layer;

at least one lens located on the encapsulation layer and located such that the at least one lens corresponds to sub-concave portions of the at least one concave portion divided by the at least one partition wall; and a color conversion layer disposed on or underneath the at least one lens, wherein the plurality of touch sensor metals do not overlap the at least one lens, wherein the at least one lens comprises a first sub-lens and a second sub-lens, which respectively correspond to a first sub-concave portion and a second sub-concave portion of the at least one concave portion divided by the at least one partition wall, and wherein the first sub-lens and the second sub-lens overlap all of an area in which the at least one partition wall is located.

23. A display device, comprising:

a substrate comprising at least one light emitting area and a non-light emitting area;

an insulating layer disposed over the substrate and comprising at least one concave portion and at least one inclined portion surrounding the at least one concave portion;

at least one partition wall located in the at least one concave portion and dividing the at least one concave portion;

a first electrode located on the insulating layer and the at least one partition wall;

a bank disposed on a portion of an upper surface of the first electrode and overlapping a portion of the at least one concave portion;

an encapsulation layer located on the first electrode and the bank;

a plurality of touch sensor metals disposed on the encapsulation layer;

at least one lens located on the encapsulation layer and located such that the at least one lens corresponds to sub-concave portions of the at least one concave portion divided by the at least one partition wall;

a color conversion layer disposed on or underneath the at least one lens;

a refraction auxiliary layer disposed on the encapsulation layer; and a black matrix disposed on the plurality of touch sensor metals and disposed in a same layer as the refraction auxiliary layer, wherein the plurality of touch sensor metals do not overlap the at least one lens, and wherein the refraction auxiliary layer overlaps all of the at least one light emitting area and a portion of the non-light emitting area.

* * * * *